(12) United States Patent
Ciubotaru

(10) Patent No.: US 9,236,841 B2
(45) Date of Patent: Jan. 12, 2016

(54) CURRENT-FEEDBACK OPERATIONAL AMPLIFIER

(71) Applicant: Analog Devices, Inc., Norwood, MA (US)

(72) Inventor: Alexandru A. Ciubotaru, Somerset, NJ (US)

(73) Assignee: Analog Devices, Inc., Norwood, MA (US)

( * ) Notice: Subject to any disclaimer, the term of this patent is extended or adjusted under 35 U.S.C. 154(b) by 64 days.

(21) Appl. No.: 14/031,806

(22) Filed: Sep. 19, 2013

(65) Prior Publication Data

US 2015/0077183 A1    Mar. 19, 2015

(51) Int. Cl.
*H03F 3/45*    (2006.01)
*H03G 3/00*    (2006.01)

(52) U.S. Cl.
CPC ........ *H03F 3/45179* (2013.01); *H03F 3/45632* (2013.01); *H03G 3/00* (2013.01); *H03F 2003/45008* (2013.01); *H03F 2200/91* (2013.01); *H03F 2203/45406* (2013.01); *H03F 2203/45424* (2013.01); *H03F 2203/45431* (2013.01)

(58) Field of Classification Search
CPC .......................................................... H03F 3/45
USPC .......................... 330/260, 258, 259, 261, 252
See application file for complete search history.

(56) References Cited

U.S. PATENT DOCUMENTS

| | | | | |
|---|---|---|---|---|
| 4,065,724 | A * | 12/1977 | Wicklund, Jr. ................. | 330/252 |
| 5,532,644 | A * | 7/1996 | Nakagawara ................. | 330/254 |
| 6,028,479 | A | 2/2000 | Babanezhad | |
| 6,492,871 | B2 | 12/2002 | Liu et al. | |
| 6,714,043 | B1 * | 3/2004 | Sharpe-Geisler ................ | 326/39 |
| 7,592,871 | B1 | 9/2009 | Dasgupta | |
| 7,834,691 | B2 * | 11/2010 | Aram ............................. | 330/253 |
| 2008/0088373 | A1 * | 4/2008 | Hong et al. .................... | 330/253 |
| 2009/0212861 | A1 * | 8/2009 | Lim et al. ....................... | 330/253 |

OTHER PUBLICATIONS

Analog Devices, "High Speed Current Feedback Op Amps", MT-057 Tutorial, Rev. 0, Oct. 2008.
Bruun, E., "CMOS Technology and Current-Feedback Op-Amps", Proc. Int. Symposium on Circuits and Systems, ISCAS 1993, pp. 1062-1065, vol. 2.
Chatterjee, S. et al., "Analog Circuit Design Techniques at 0.5 V", Springer, 2007, Ch 2, pp. 22-33.
Ismail, A.M. et al., "Novel CMOS Current Feedback Op-Amp Realization Suitable for High Frequency Applications", IEEE Trans. Circuits Syst. I, Jun. 2000, pp. 918-921, vol. 47, No. 6.

(Continued)

*Primary Examiner* — Henry Choe
(74) *Attorney, Agent, or Firm* — Knobbe Martens Olson & Bear LLP

(57) ABSTRACT

An integrated, fully-differential current-feedback transimpedance operational amplifier circuit is disclosed. The circuit can be configured as a class-AB, low-impedance input stage, followed by an inverter-based, rail-to-rail output stage. For enhancing the open-loop transimpedance gain of the amplifier without consuming additional DC power, the same bias current is used both in the input stage and in a gain-enhancement stage serving as its load. The gain-enhancement stage can be either DC- or AC-coupled to the input of the amplifier. In the case of DC coupling, an output common-mode feedback loop can be used to provide the proper operating voltages in the amplifier.

19 Claims, 14 Drawing Sheets

(56) References Cited

OTHER PUBLICATIONS

Manetakis, K. et al., "Current-feedback opamp suitable for CMOS VLSI technology", Electronics Letters, 6th Jun. 1996, pp. 1090-1092, vol. 32, No. 12.

Pennisi, S., "High-performance CMOS Current Feedback Operational Amplifier", Proc. Int. Symposium on Circuits and Systems, ISCAS 1995, pp. 1573-1576, vol. 2.

Selvanayagam, S. et al., "Wide bandwidth CMOS current feedback op amp for inverting amplifier applications", IEE Colloquium on Wideband Circuits, Modeling and Techniques, May 16, 1996, pp. 7/1-7/4.

Toumazou, C. et al. (editors), "Analogue IC design; the current-mode approach", Peter Peregrinus Ltd., 1990, Ch. 4, pp. 160-165, Ch. 16, pp. 579-583.

* cited by examiner

CURRENT-FEEDBACK OPERATIONAL AMPLIFIER

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Operational amplifiers are well-known building blocks. A class of operational amplifier is known as a voltage-mode or voltage-feedback operational amplifier. Voltage-feedback operational amplifiers have limitations at high frequencies, primarily related to the saturation of the input stage and the subsequent slew-rate limitation.

SUMMARY

By using a different architecture for the input stage of the operational amplifier, which accepts currents rather than voltages, a substantial improvement in the overall high-frequency performance of the device may be achieved. In this case, the operational amplifier is known as a current-feedback operational amplifier.

Embodiments may comprise an input stage, a current to voltage converter including current mirrors, and an output stage including output transistors having a common-emitter connection. One drawback is the limited output voltage range due to the common-emitter connection of the output transistors. Often the current mirrors only redirect and combine the currents coming out of the input stage without any amplification. This can lead to relatively large power consumption in the circuit.

Embodiments of a current-feedback operational amplifier that overcome the limited output voltage range and relatively large power consumption drawbacks are disclosed. The circuit has differential input and output and can be implemented in CMOS or bipolar integrated-circuit technologies. In an embodiment, the input of the circuit is a class-AB, low-impedance stage, whose bias current is re-used in a gain-enhancing stage connected as its load. The gain-enhancing stage accepts the same input signals as the main amplifier, either directly or using small DC-blocking capacitors, which do not require a prohibitively large area in integrated circuits, and provides an improvement in amplifier open-loop transimpedance without consuming additional power. The output of the operational amplifier consists of inverters connected directly to the input and gain-enhancing stages, without using current for additional current mirrors or folded cascodes for input-signal routing and extraction. In low-voltage CMOS implementations, forward bulk biasing can be used for reducing the threshold voltages for the input transistors. Embodiments of the disclosed current-feedback operational amplifier can be used either as a stand-alone high-frequency amplifier in closed-loop configurations, or in more complex circuits such as integrated high-frequency filters.

According to one aspect, an apparatus comprising an operational amplifier is disclosed. The operational amplifier comprises an input stage configured to receive a differential input current at an input port and to generate a first voltage signal. The differential current corresponds to a difference between a first input current at a non-inverting input node and a second input current at an inverting input node. The input stage comprises a first input transistor, a second input transistor, a third input transistor, and a fourth input transistor. The operational amplifier further comprises a gain-enhancement stage comprising a first gain-enhancement transistor, a second gain-enhancement transistor, a third gain-enhancement transistor, and a fourth gain-enhancement transistor. The first and third input transistors and the third and fourth gain-enhancement transistors comprise a first semiconductor type, and the second and fourth input transistors and the first and second gain-enhancement comprise a second semiconductor type complementary to the first semiconductor type. A source of the first input transistor, a source of the second input transistor, a gate of the second gain-enhancement transistor, and a gate of the fourth gain-enhancement transistor are operatively coupled to the non-inverting input node, and a source of the third input transistor, a source of the fourth input transistor, a gate of the first gain-enhancement transistor, and a gate of the third gain-enhancement transistor are operatively coupled to the inverting input node, such that the gates of the gain-enhancement transistors are cross-coupled to the input port to provide a second voltage signal in phase with the first voltage signal. A gate of the first input transistor and a gate of the third input transistor are operatively coupled to a first input stage bias voltage, and a gate of the second input transistor and a gate of the fourth input transistor are operatively coupled to a second input stage bias voltage.

The apparatus further comprises a first tail transistor and a second tail transistor, and a common-mode control circuit comprising a first control circuit and a second control circuit where the first control circuit is configured to provide a voltage to a gate of the first tail transistor and the second control circuit is configured to provide a voltage to a gate of the second tail transistor, and where through local common-mode negative feedback, the common-mode control circuit is configured to control the first and second tail transistors for biasing DC operating currents of the input stage. The apparatus further comprises an output stage configured to provide a differential voltage at an output port. The differential voltage corresponds to a difference between a first output voltage at an inverting output node and a second output voltage at a non-inverting output node. The output stage comprises a first output transistor, a second output transistor, a third output transistor, and a fourth output transistor; where the first and third output transistors comprise the first transistor type, and the second and fourth output transistors comprise the second, complementary transistor type.

In an embodiment, a gate of the first output transistor is operatively coupled to a first input of the first control circuit, a drain of the first gain-enhancement transistor, and a drain of the first input transistor. A gate of the second output transistor is operatively coupled to a first input of the second control circuit, a drain of the third gain-enhancement transistor, and a drain of the second input transistor, wherein a drain of the first output transistor and a drain of the second output transistor are operatively coupled to the first output node.

In an embodiment, a gate of the third output transistor is operatively coupled to a second input of the first control circuit, a drain of the second gain-enhancement transistor, and a drain of the third input transistor. A gate of the fourth output transistor is operatively coupled to a second input of the second control circuit, a drain of the fourth gain-enhancement transistor, and a drain of the fourth input transistor, and a drain of the third output transistor and a drain of the fourth output transistor are operatively coupled to the second output node.

The first control circuit comprises a first pair of common-mode resistors arranged in series comprising a first end configured to provide the first input, a second end configured to provide the second input, and a common-node configured to provide the output of the first control circuit. The second control circuit comprises a second pair of common-mode resistors arranged in series comprising a first end configured to provide the first input, a second end configured to provide the second input, and a common-node configured to provide the output of the second control circuit.

In an embodiment, DC drain currents of the first and second output transistors are approximately equal to DC drain currents of the first and second input transistors, and DC drain currents of the third and fourth output transistors are approximately equal to DC drain currents of the third and fourth input transistors.

In an embodiment, the first control circuit further comprises a third common-mode resistor, a first current source, and a second current source, where a first node of the first current source is coupled to the gate of a first tail transistor and a first end of the third common-mode resistor, where a second end of the third common-mode resistor is coupled to the common-node of the first pair of common-mode resistors and a first node of the second current source. The second control circuit further comprises a fourth common-mode resistor, a third current source, and a fourth current source, where a first node of the third current source is coupled to the gate of a second tail transistor and a first end of the fourth common-mode resistor, and where a second end of the fourth common-mode resistor is coupled to the common-node of the second pair of common-mode resistors and a first node of the fourth current source. Currents flowing through the third and the fourth common-mode resistors level-shift voltages at common-mode control circuit inputs to vary drain-source headroom of input stage transistors and gain-enhancement stage transistors.

The common-mode control circuit further comprises a third control circuit comprising an operational transconductance amplifier and a third pair of common-mode resistors arranged in series comprising a common-node, where the third pair of common mode resistors are operatively coupled to a non-inverting input of the operational transconductance amplifier via the common node, a first end of the third pair operatively coupled to the inverting output node, and a second end of the third pair operatively coupled to the non-inverting output node. An inverting input of the operational transconductance amplifier is provided with a common-mode reference voltage, and an output of the operational transconductance amplifier is coupled to the drain of the second tail transistor, and where the operational transconductance amplifier is configured to generate an output DC current that is superimposed on a DC drain current of the second tail transistor and closes a negative feedback loop through the gain-enhancement stage and the output stage.

The gain-enhancement stage further comprises a first gain-enhancement capacitor, a second gain-enhancement capacitor, and a first pair of gain-enhancement resistors arranged in series comprising a common-node coupled to the common-node of the first common-mode resistor pair. A first end is operatively coupled to the gate of the first gain-enhancement transistor, and a second end is coupled to the gate of the second gain-enhancement transistor, where the gate of the first gain-enhancement transistor is AC coupled to the inverting input node through the first gain-enhancement capacitor, and where the gate of the second gain-enhancement transistor is AC coupled to the non-inverting input node through the second gain-enhancement capacitor.

In an embodiment, the first, second, third and fourth input transistors are biased to reduce transistor threshold voltages, where a body diode of the first input transistor and a body diode of the third input transistor are provided with a first forward body bias voltage, and where a body diode of the second input transistor and a body diode of the fourth input transistor are provided with a second forward body bias voltage.

The apparatus further comprises a bias generator configured to generate the first input bias voltage. The bias generator comprises a first amplifier, a first current source, an input replica transistor, a gain-enhancement replica transistor, and a tail replica transistor. An inverting input of the amplifier is coupled to a source of the input replica transistor, a gate of the gain-enhancement replica transistor, and a first node of the current source. A drain of the gain-enhancement replica transistor is coupled to a drain of the input replica transistor and a gate of the tail replica transistor. A non-inverting input of the amplifier is coupled to a common-mode reference voltage. An output of the amplifier provides the first input bias voltage; and the input replica transistor is configured to replicate a transistor of the input stage.

The apparatus further comprises a bias generator configured to generate the first bias voltage, where the bias generator comprises a first amplifier, a first current source, an input replica transistor, and a gain-enhancement replica transistor. An inverting input of the amplifier is coupled to a source of the input replica transistor and a first node of the current source. A drain and gate of the gain-enhancement replica transistor are coupled to a drain of the input replica transistor. A non-inverting input of the amplifier is coupled to a common-mode reference voltage. An output of the amplifier provides the first input bias voltage, and a drain circuit of the input replica transistor replicates a drain circuit of the input stage.

According to another aspect an apparatus comprising an operational amplifier is disclosed. The operational amplifier comprises an input stage configured to receive a differential input current at an input port and provide a first voltage signal. The differential current corresponds to a difference between a first input current at a non-inverting input node and a second input current at an inverting input node, where the input stage comprises a first input transistor, a second input transistor, a third input transistor, and a fourth input transistor. The operational amplifier further comprises a gain-enhancement stage comprising a first gain-enhancement transistor, a second gain-enhancement transistor, a third gain-enhancement transistor, and a fourth gain-enhancement transistor, where the first and third input transistors and the third and fourth gain-enhancement transistors comprise a first transistor type, and where the second and fourth input transistors and the first and second gain-enhancement comprise a second transistor type. Further, an emitter of the first input transistor, an emitter of the second input transistor, a base of the second gain-enhancement transistor, and a base of the fourth gain-enhancement transistor are coupled to the non-inverting input node, and an emitter of the third input transistor, an emitter of the fourth input transistor, a base of the first gain-enhancement transistor, and a base of the third gain-enhancement transistor are coupled to the inverting input node, such that the bases of the gain-enhancement transistors are cross-coupled to the input port to provide a second voltage signal in phase with the first voltage signal. A base of the first input transistor and a base of the third input transistor are coupled to a first input stage bias voltage, and a base of the second input transistor and a base of the fourth input transistor are coupled to a second input stage bias voltage.

The apparatus further comprises a common-mode control circuit comprising a first control circuit and a second mode control circuit, and an output stage configured to provide a differential voltage at an output port. The differential voltage corresponds to a difference between a first output voltage at an inverting output node and a second output voltage at a non-inverting output node. The output stage comprises a first output transistor, a second output transistor, a third output transistor, and a fourth output transistor, where the first and third output transistors comprise the first transistor type and the second and fourth output transistors comprise the second transistor type.

The apparatus further comprises a bias generator configured to provide the first bias input voltage. The bias generator comprises a first amplifier, a first current source, an input replica transistor, and a gain-enhancement replica transistor. An inverting input of the amplifier is coupled to an emitter of the input replica transistor and a first node of the current source; a base and collector of the gain-enhancement replica transistor are coupled to a collector of the input replica transistor; and a non-inverting input of the amplifier is coupled to a common-mode reference voltage. An output of the amplifier provides the first input bias voltage, and the input replica transistor replicates a transistor of the input stage.

According to another aspect, an apparatus comprising an operational amplifier is disclosed. The operational amplifier comprises an input stage configured to receive a differential input current signal at a first input node and a second input node. The input stage is configured to be biased by a bias current, and transistors of the input stage are configured to operate in a common-gate or common-base configuration. The operational amplifier further comprises a load stage in series with the input stage, where the load stage is configured to be biased by the same bias current as the input stage. Transistors of the load stage are configured to operate in a common-source or common-emitter configuration and the transistors of the load stage are paired with the transistors of the input stage and are configured to serve as loads for the transistors of the input stages, where a pair comprises a first transistor of a first semiconductor type and a second transistor of a second semiconductor type complementary to the first semiconductor type. A source or emitter of the first transistor is operatively coupled to the first input node, and a gate or base of the second transistor is operatively coupled to the second input node.

The apparatus further comprises an output stage configured to generate an output signal and the output stage comprises a plurality of transistors including a third transistor, where the third transistor is configured to operate in a common-source or common-emitter configuration. The third transistor is of the first semiconductor type, where a gate or base of the third transistor is operatively coupled to a source of the first transistor and to the drain of the second transistor, and the drain of the third transistor is configured to drive a portion of the output signal.

The apparatus further comprises a first tail transistor configured to source current to the load stage, a second tail transistor configured to sink current from the load stage, and a common-mode control circuit configured to bias the first tail transistor and the second tail transistor for control of a common mode voltage of the output signal to control a common-mode voltage of the differential output signal, where the output signal comprises a differential output signal.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION

Figure 1:
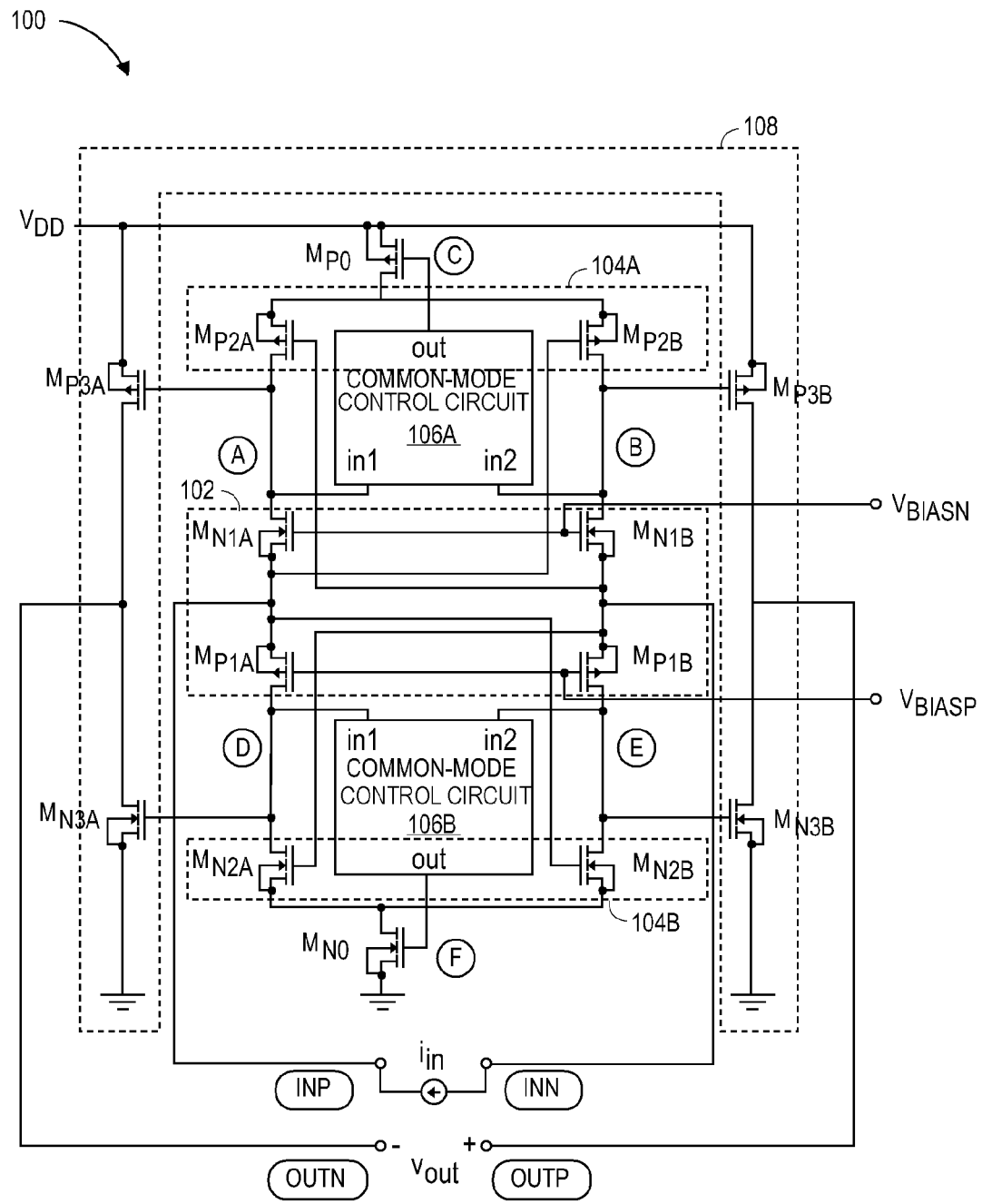
FIG. 1 is a schematic diagram illustrating a differential CMOS current-feedback operational amplifier, according to certain embodiments.

The following detailed description of certain embodiments presents various descriptions of specific embodiments of the invention. However, the invention can be embodied in a multitude of different ways as defined and covered by the claims. In this description, reference is made to the drawings where like reference numerals indicate similar elements.

FIG. 1 illustrates an embodiment of a differential complementary metal-oxide-semiconductor (CMOS) current-feedback operational amplifier 100 having input ports INP, INN and output ports OUTN, OUTP. The current-feedback operational amplifier 100 comprises an input stage 102, two complementary gain-enhancement stages 104A, 104B, two complementary common-mode control circuits 106A, 106B configured to provide biasing, a pseudo-differential output stage 108, and tail transistors $M_{P0}$, and $M_{N0}$.

The input stage 102 comprises complementary transistors $M_{P1A}$, $M_{P1B}$ and $_{MN1A}$, $M_{N1B}$ biased by voltages $V_{BIASP}$ and $V_{BIASN}$, respectively. In one embodiment, the input stage 102 comprises a class-AB input stage. The complementary gain-enhancement stages 104A, 104B comprise transistors $M_{P2A}$, $M_{P2B}$ and $M_{N2A}$, $M_{N2B}$ respectively, whose gates are cross-coupled to amplifier inputs INP and INN, and provide additional voltage signals at nodes A, B, D, and E in phase with the voltage signals generated by the input stage 102 to provide gain enhancement. In one embodiment, the biasing currents flowing through the gain-enhancement stages 104A, 104B are the same as the biasing currents flowing through the input stage 102, which advantageously saves power.

The common-mode control circuits 106A, 106B provide a voltage associated with $(v_A+v_B)/2$ and $(v_D+v_E)/2$ to gates of the tail transistors $M_{P0}$, and $M_{N0}$ at nodes C and F, respectively, and through local common-mode negative feedback assist the tail transistors $M_{P0}$, and $M_{N0}$ in absorbing the DC operating currents of the input stage 102. In one embodiment, the voltages at the nodes C and F are approximately proportional to $(v_A+v_B)/2$ and to $(v_D+v_E)/2$, respectively. Finally, the pseudo-differential output stage 108 comprises two inverters where each inverter includes transistors $M_{P3A}$, $M_{P3B}$ and $M_{N3A}$, $M_{N3B}$ respectively. With the transistors $M_{P3A}$, $M_{P3B}$ and $M_{N3A}$, $M_{N3B}$ and their bias currents properly chosen, the transistors $M_{P3A}$, $M_{P3B}$ and $M_{N3A}$, $M_{N3B}$ can operate in the saturation region in common process technologies, such as, for example, 120 nm CMOS processes, 65 nm CMOS processes, and the like, using $V_{DD}$ supply voltages such as, for example, approximately 1.2 V. In one embodiment, a CMOS implementation comprises isolated well technology to provide small transistor threshold voltages. However, the principles and advantages disclosed are also applicable to embodiments that do not utilize isolated well technology.

The operational amplifier 100 is configured to receive a differential current input $i_{in}$ at the inverting and non-inverting input ports INN, INP, respectively and to generate a differential voltage output signal $V_{out+}$, $V_{out-}$ at the non-inverted and inverted output ports OUTP, OUTN. In an embodiment, the transistors comprise enhancement mode Field Effect Transistors (FETs) having a gate, a drain, a source, and a body terminal coupled to the source. For example, these FETs can be produced by a CMOS process.

In the input stage 102, a source and body of transistor $M_{N1A}$ are coupled to a source and body of transistor $M_{P1A}$, to the non-inverting input port INP, to a gate of transistor $M_{N2B}$ in the gain-enhancement stage 104B, and to a gate of transistor $M_{P2B}$ in the gain-enhancement stage 104A. In the illustrated embodiment, transistors $M_{N1A\ and\ MN2B}$ correspond to N-channel FETs, and transistors $M_{P1A}$ and $M_{P2B}$ correspond to P-channel FETs. A P-channel FET is complementary to an N-channel FET. A source and body of transistor $M_{N1B}$ are coupled to a source and body of transistor $M_{P1B}$, to the inverting input port INN, to a gate of transistor $M_{N2A}$ in the gain-enhancement stage 104B, and to a gate of transistor $M_{P2A}$ in the gain-enhancement stage 104A. A gate of transistor $M_{P1A}$ is coupled to a gate of transistor $M_{P1B}$ and to the bias voltage $V_{BIASP}$. A gate of transistor $M_{N1A}$ is coupled to a gate of transistor $M_{N1B}$ and to the bias voltage $V_{BIASN}$.

Further in the input stage 102, a drain of transistor $M_{N1A}$ is coupled to an input in1 of the common-mode control circuit 106A, to a gate of output stage transistor $M_{P3A}$, and to a drain of transistor $M_{P2A}$ in the gain-enhancement stage 104A. A drain of transistor $M_{N1B}$ is coupled to an input in2 of the common-mode control circuit 106A, to a gate of output stage transistor $M_{P3B}$, and to a drain of transistor $M_{P2B}$ in the gain-enhancement stage 104A. A drain of transistor $M_{P1A}$ is coupled to an input int of the common-mode control circuit 106B, to a gate of output stage transistor $M_{N3A}$, and to a drain of transistor $M_{N2A}$ in the gain-enhancement stage 104B. A drain of transistor $M_{P1B}$ is coupled to an input in2 of the common-mode control circuit 106B, to a gate of output stage transistor $M_{N3B}$, and to a drain of transistor $M_{N2B}$ in the gain-enhancement stage 104B.

In the gain-enhancement stages 104A, 104B, a source and body of transistor $M_{P2A}$ couple to a source and body of transistor $M_{P2B}$ and to a drain of tail transistor $M_{P0}$, and a source and body of transistor $M_{N2A}$ couple to a source and body of transistor $M_{N2B}$ and to a drain of tail transistor $M_{N0}$. As described above, the gate of transistor $M_{P2A}$ is coupled to the source and body of input stage transistor $M_{N1B}$, to the source and body of input stage transistor $M_{P1B}$, to the inverting input port INN, and to a gate of transistor $M_{N2A}$; the gate of transistor $M_{P2B}$ is coupled to the source and body of transistor input stage $M_{N1A}$, to the source and body of input stage transistor $M_{P1A}$, to the non-inverting input port INP, and to the gate of transistor $M_{N2B}$.

Further, as described above, the drain of transistor $M_{P2A}$ is coupled to the drain of input stage transistor $M_{N1A}$, to the input in1 of the common-mode control circuit 106A, and to the gate of output stage transistor $M_{P3A}$; the drain of transistor $M_{P2B}$ is coupled to the drain of input stage transistor $M_{N1B}$, to the input in2 of the common-mode control circuit 106A, and to a gate of output stage transistor $M_{P3B}$, the drain of transistor $M_{N2A}$ is coupled to the drain of input stage transistor $M_{P1A}$, to the input int of the common-mode control circuit 106B, to a gate of output stage transistor $M_{N3A}$; and the drain of transistor $M_{N2B}$ is coupled to the drain of input stage $M_{P1B}$, to the input in2 of the common-mode control circuit 106B, and to a gate of output stage transistor $M_{N3B}$.

In the common-mode control circuit 106A, an output is coupled to a gate of tail transistor $M_{P0}$. As described above, the input int is coupled to the drain of gain-enhancement stage transistor $M_{P2A}$, to the drain of input stage transistor $M_{N1A}$, and to the gate of output stage transistor $M_{P3A}$, and the input in2 is coupled to the drain of gain-enhancement stage transistor $M_{P2B}$, to the drain of input stage transistor $M_{N1B}$, and to a gate of output stage transistor $M_{P3B}$.

In the common-mode control circuit 106B, an output is coupled to a gate of tail transistor $M_{N0}$. As described above, the input int is coupled to the drain of gain-enhancement stage transistor $M_{N2A}$, to the drain of input stage transistor $M_{P1A}$, and to the gate of output stage transistor $M_{N3A}$ and the input in2 is coupled to the drain of gain-enhancement stage transistor $M_{N2B}$, to the drain of input stage transistor $M_{P1B}$, and to a gate of output stage transistor $M_{N3B}$.

In the output stage 108, a source and body of transistor $M_{P3A}$ and a source and body of transistor $M_{P3B}$ couple to a first voltage $V_{DD}$ and a source and body of transistor $M_{N2A}$ and a source and body of transistor $M_{N2B}$ couple to a second voltage GND. A drain of transistor $M_{P3A}$ is coupled to a drain of transistor $M_{N3A}$ and to the inverting output port OUTN, and a drain of transistor $M_{P3B}$ is coupled to a drain of transistor $M_{N3B}$ and to the non-inverting output port OUTP.

As described above, the gate of transistor $M_{P3A}$ is coupled to the input int of the common-mode control circuit 106A, to the drain of gain-enhancement stage transistor $M_{P2A}$, and to the drain of input stage transistor M enhancement the gate of output stage transistor $M_{P3B}$ is coupled to the input in2 of the common-mode control circuit 106A, to the drain of gain-enhancement stage transistor $M_{P2B}$, and to the drain of input stage transistor $M_{N1B}$; the gate of output stage transistor $M_{N3A}$ is coupled to the input in1 of the common-mode control circuit 106B, to the drain of gain-enhancement stage transistor $M_{N2A}$, and to the drain of input stage transistor $M_{P1A}$; and the gate of transistor $M_{N3B}$ is coupled to the input in2 of the common-mode control circuit 106B, to the drain of gain-enhancement stage transistor $M_{N2B}$, and to the drain of input stage transistor $M_{P1B}$.

A source and body of tail transistor $M_{P0}$ are coupled to the first voltage $V_{DD}$; the gate of the tail transistor $M_{P0}$ is coupled to the output of the common-mode control circuit 106A, and the drain of the tail transistor $M_{P0}$ is coupled to source and body of the gain-enhancement stage transistor $M_{P2A}$ and to the source and body of the gain-enhancement stage transistor $M_{P2B}$.

A source and body of tail transistor $M_{N0}$ are coupled to the second voltage GND; the gate of the tail transistor $M_{N0}$ is coupled to the output of the common-mode control circuit 106B; and the drain of the tail transistor $M_{N0}$ is coupled to source and body of the gain-enhancement stage transistor $M_{N2A}$ and to the source and body of the gain-enhancement stage transistor $M_{N2B}$.

Figure 2:
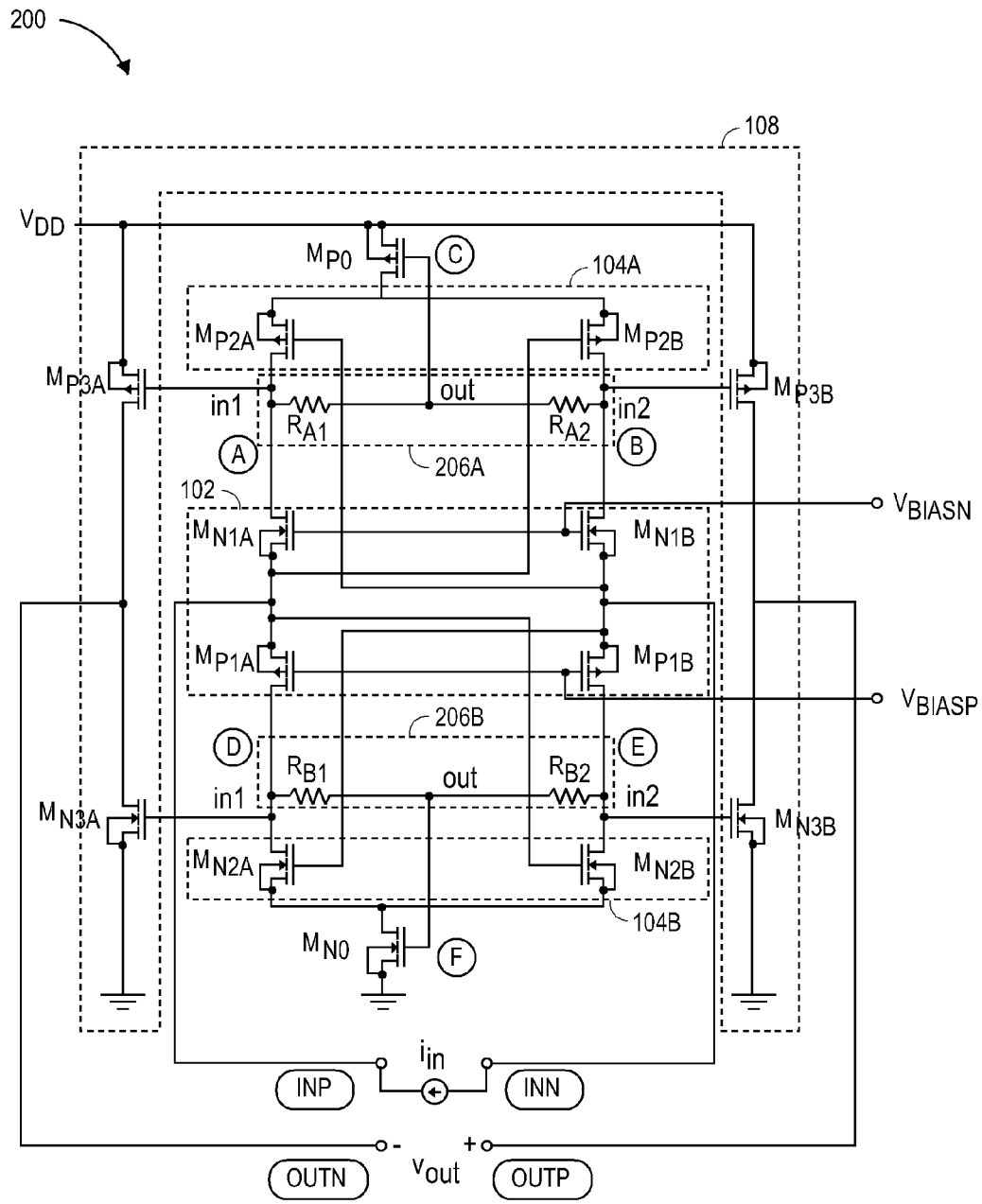
FIG. 2 is a schematic diagram illustrating a CMOS current-feedback operational amplifier using common-mode control circuits comprising two resistors, according to certain embodiments.

The operation of the amplifier 100 can be better understood in the context of a simple embodiment of the common-mode control circuits 106A, 106B. FIG. 2 illustrates an operational amplifier 200 comprising the input ports INP, INN, the output ports OUTN, OUTP, the input stage 102, the two complementary gain-enhancement stage 104A, 104B, the pseudo-differential output stage 108, and the tail transistors $M_{P0}$ and $M_{N0}$ as described above in FIG. 1 with respect the operational amplifier 100.

The current-feedback operational amplifier 200 further comprises two complementary common-mode control circuits 206A, 206B to provide biasing. In one embodiment, each complementary common-mode control circuit 206A, 206B comprises two resistors $R_{A1}$, $R_{A2}$ and $R_{B1}$, $R_{B2}$, respectively. The common-mode control circuit 206A comprises resistor $R_{A1}$ in series with resistor $R_{A2}$ such that a second end of resistor $R_{A1}$ is coupled to a first end of resistor $R_{A2}$. Referring to FIGS. 1 and 2, the common-node of resistors $R_{A1}$ and $R_{A2}$ form node C, which is used as an output, a first end of resistor $R_{A1}$ forms an input in1, and the second end of the resistor $R_{A2}$ forms an input in2 of the common-mode control circuit 206A.

Similarly, the common-mode control circuit 206B comprises resistor $R_{B1}$ in series with resistor $R_{B2}$ such that a second end of resistor $R_{B1}$ is coupled to a first end of resistor $R_{B2}$. Referring to FIGS. 1 and 2, the common-node of resistors $R_{B1}$ and $R_{B2}$ form an output, a first end of resistor $R_{B1}$ forms an input in1, and the second end of the resistor $R_{B2}$ forms an input in2 of the common-mode control circuit 206B.

In the operational amplifier 200, due to the balance between the positive and negative signal paths, the signal components of $v_A$, $v_B$, and $v_D$, $v_E$, approximately cancel each other at nodes C and F, respectively. This results in approximately pure DC voltages on the gates of the tail transistors $M_{P0}$ and $M_{N0}$. From a DC bias standpoint, assuming that gain-enhancement transistors $M_{P2A}$, $M_{P2B}$ and $M_{N2A}$, $M_{N2B}$ do not upset the saturation condition of the tail transistors $M_{P0}$ and $M_{N0}$, respectively, then the tail transistors $M_{P0}$ and $M_{N0}$ appear as metal-oxide-semiconductor (MOS) diodes electrically coupled to the input stage 102, and accommodate the drain currents of input transistors $M_{N1A}$, $M_{N1B}$ and $M_{P1A}$, $M_{P1B}$, respectively, through local negative feedback. While the term "MOS" is used herein, those of ordinary skill in the art will appreciate that gates of MOS transistors can be made from materials other than metals, such as polysilicon, and that insulators for these gates can be made from materials other than silicon oxide, such as high-k dielectrics. Because no or approximately no DC currents flow through the common-mode control circuit resistors $R_{A1}$, $R^{A2}$, $R_{B1}$, $R_{B2}$, the DC voltages on nodes A, B and D, E are equal or approximately equal to the DC gate voltages of the tail transistors $M_{P0}$ and $M_{N0}$, respectively. As a consequence, the DC drain currents of the output transistors $M_{P3A}$, $M_{P3B}$ and $M_{N3A}$, $M_{N3B}$ are equal or approximately equal scaled versions of the drain currents of the tail transistors $M_{P0}$ and $M_{N0}$, respectively, and equal or approximately equal scaled versions of the DC drain currents of the input transistors $M_{N1A}$, $M_{N1B}$ and $M_{P1A}$, $M_{P1B}$, respectively.

The transistors and their bias currents can be chosen such that the transistors operate in the saturation region. When all of the transistors operate in the saturation region, the input current flowing into the amplifier inputs INP and INN through input transistors $M_{N1A}$, $M_{N1B}$ and $M_{P1A}$, $M_{P1B}$ causes voltage signals to develop on high-impedance nodes A, B, D, E. At approximately the same time, the voltages developed on the amplifier inputs INP and INN by the input current flowing into a non-zero equivalent impedance are applied to the differential pairs made up of gain-enhancement transistors $M_{P2A}$, $M_{P2B}$ and $M_{N2A}$, $M_{N2B}$ respectively, and translated into currents that are also injected into nodes A, B, D, E in phase with the original input currents. This increases the voltages on the nodes A, B, D, E, which in turn, causes the output transistors $M_{P3A}$, $M_{P3B}$ and $M_{N3A}$, $M_{N3B}$ to generate voltages on amplifier outputs OUTP and OUTN.

In an embodiment, input transistors $M_{N1A}$, $M_{N1B}$ and $M_{P1A}$, $M_{P1B}$ are scaled such that their small-signal transconductances are equal or approximately equal ($g_{mN1}=g_{mP1}$, respectively) and gain-enhancement transistors $M_{N2A}$, $M_{N2B}$, and $M_{P2A}$, $M_{P2B}$ are scaled such that their small-signal transconductances are equal or approximately equal ($g_{mN2}=g_{mP2}$, respectively). The transimpedance open-loop gain of the operational amplifier 200 can be calculated by first writing the small-signal voltages on nodes A, B, D, E as functions of the small-signal input current $i_{in}$:

$$v_A = -v_B = \frac{\frac{i_{in}}{2} + \frac{i_{in}}{2}\frac{g_{mP2}}{g_{mN1}}}{\frac{1}{R} + g_{dsN1} + g_{dsP2}}, \quad (1)$$

$$v_D = -v_E = \frac{\frac{i_{in}}{2} + \frac{i_{in}}{2}\frac{g_{mN2}}{g_{mP1}}}{\frac{1}{R} + g_{dsP1} + g_{dsN2}}, \quad (2)$$

where $g_{dsN1}$, $g_{dsP1}$, $g_{dsN2}$, $g_{dsP2}$ are the drain-source conductances of devices $M_{N1A}/M_{N1B}$, $M_{P1A}/M_{P1B}$, $M_{N2A}/M_{N2B}$, $M_{P2A}/M_{P2B}$, respectively.

The numerator term $$\frac{i_{in}}{2}\frac{g_{mP2}}{g_{mN1}} \left( = \frac{i_{in}}{2}\frac{g_{mN2}}{g_{mP1}} \right)$$

represents the contribution of the gain-enhancement stage 104A, 104B. In other words, if the gain-enhancement transistors $M_{P2A}$, $M_{N2A}$ and $M_{P2B}$, $M_{N2B}$ are not connected with their gates cross-coupled to the input ports INN and INP, respectively, as shown in FIG. 2, but instead were connected in a classical fashion as current sources, these terms would be missing from Equations (1) and (2), and voltages $v_A$, $v_B$, $v_D$, $v_E$ would be correspondingly smaller.

In another embodiment, when the input transistors $M_{N1A}$, $M_{N1B}$ and $M_{P1A}$, $M_{P1B}$ and gain-enhancement transistors $M_{N2A}$, $M_{N2B}$, and $M_{P2A}$, $M_{P2B}$ are scaled such that such that their small-signal transconductances are equal or approximately equal ($g_{mP2}=g_{mN1}$ or, equivalently, $g_{mN2}=g_{mP1}$), the additional contribution from the gain-enhancement stage 104A, 104B is equal or approximately equal to the contribution originating from the input stage 102, which translates into a gain increase by a factor of approximately 2, or approximately 6 dB. This is significant and very useful at high frequencies, especially because no additional or approximately no additional DC current is consumed.

A further improvement can be achieved for the gain-enhancement contribution by device scaling. That is by choosing the relative width to length (W/L) ratios of the input transistors $M_{N1A}$, $M_{N1B}$ and $M_{P1A}$, $M_{P1B}$ and gain-enhancement transistors $M_{N2A}$, $M_{N2B}$, and $M_{P2A}$, $M_{P2B}$ such that $$\frac{g_{mP2}}{g_{mN1}} = \frac{g_{mN2}}{g_{mP1}} > 1.$$

With $V_A$, $V_B$, $V_D$, $V_E$ as calculated above in Equations (1) and (2), the transimpedance open-loop gain of the operational amplifier 200 is:

$$a_z = \frac{1}{\frac{2}{R_{LOAD}} + g_{dsP3} + g_{dsN3}} \left[ \frac{g_{mP3}\left(1 + \frac{g_{mP2}}{g_{mN1}}\right)}{\frac{1}{R} + g_{dsN1} + g_{dsP2}} + \frac{g_{mN3}\left(1 + \frac{g_{mN2}}{g_{mP1}}\right)}{\frac{1}{R} + g_{dsP1} + g_{dsN2}} \right], \quad (3)$$

where $a_z = v_{out}/i_{in}$, $g_{dsP3}$ and $g_{dsN3}$ are the drain-source conductances of the output transistors $M_{P3A}/M_{P3B}$ and $M_{N3A}/M_{N3B}$, respectively, and $R_{LOAD}$ is a hypothetical load resistance connected differentially between the amplifier outputs OUTP and OUTN.

Figure 3:
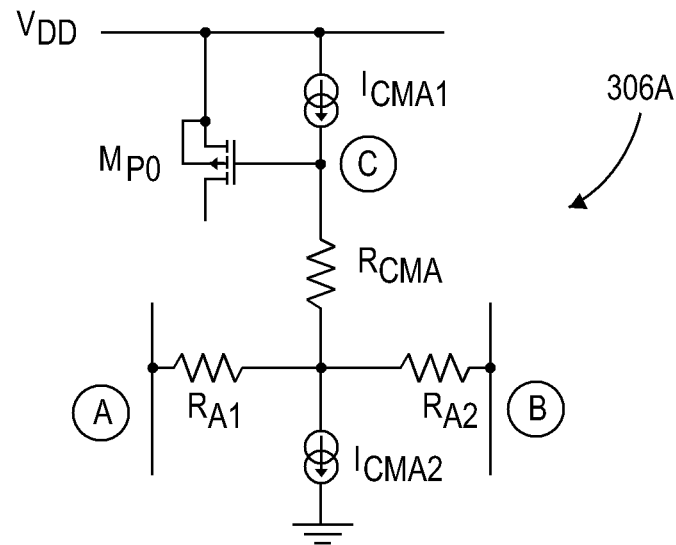
FIG. 3 is a schematic diagram illustrating embodiments of common-mode control circuits that can be used in the CMOS current-feedback operational amplifier, according to certain embodiments.
Figure 3:
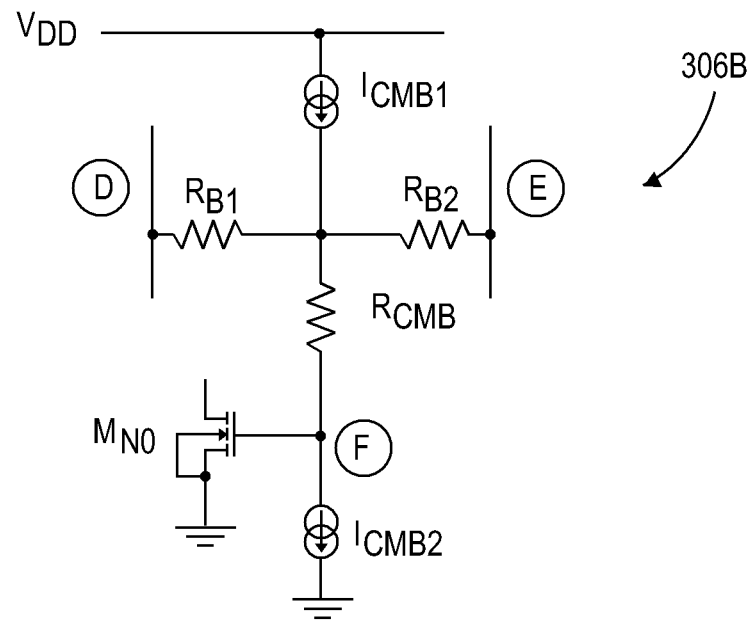

FIG. 3 is a schematic diagram illustrating a common-mode control circuit 306 comprising complementary common-mode control circuits 306A, 306B that can be used in the current-feedback operational amplifier 100 of FIG. 1 for the common-mode control circuits 106A, 106B. It should be noted that the common-mode control circuits 306A, 306B do not include the tail transistors $M_{P0}$ and $M_{N0}$ that are illustrated in FIG. 3 to show connectivity to the same. Common-mode control circuit 306A comprises two series coupled resistors $R_{A1}$, $R_{A2}$, a common-mode resistor $R_{CMA}$, a first current source $I_{CMA1}$, and a second current source $I_{CMA2}$ ($I_{CMA1}=I_{CMA2}=I_{CM}$). Referring to FIGS. 1 and 3, resistors $R_{A1}$, $R_{A2}$ couple in series and the first end of resistor $R_{A1}$ forms an input in1 and the second end of resistor $R_{A2}$ forms the input in2 at nodes A and B, respectively, of the common-mode control circuit 306A. The common-node of series resistors $R_{A1}$, $R_{A2}$ is coupled to a first end of resistor $R_{CMA}$ and to a first terminal of the second current source $I_{CMA2}$. A second terminal of the second current source $I_{CMA2}$ is coupled to the second voltage GND. A second terminal of resistor $R_{CMA}$ couples to a first terminal of the first current source $I_{CMA1}$ and to the gate of the tail transistor $M_{P0}$ at node C. The common-mode control circuit 306A generates a voltage at the node C for control of biasing current to be sourced to the gain-enhancement stage 104A for control of the common-mode voltage. A second terminal of the first current source $I_{CMA1}$ is coupled to the first voltage $V_{DD}$.

In a similar but complementary manner, the common-mode control circuit 306B comprises two series coupled resistors $R_{B1}$, $R_{B2}$, a common-mode resistor $R_{CMB}$, a first current source $I_{CMB1}$, and a second current source $I_{CMB2}$ ($I_{CMB1}=I_{CMB2}=I_{CM}$). Again referring to FIGS. 1 and 3, resistors $R_{B1}$, $R_{B2}$ couple in series and the first end of resistor $R_{B1}$ forms the input in1, and the second end of resistor RB2 forms the input in2 at nodes D and E, respectively, of the common-mode control circuit 306B. The common-node of series resistors $R_{B1}$, $R_{B2}$ is coupled to a first end of resistor $R_{CMB}$ and to a first terminal of the first current source $I_{CMB1}$. A second terminal of the first current source $I_{CMB1}$ is coupled to the first voltage $V_{DD}$. A second terminal of resistor $R_{CMB}$ is coupled to a first terminal of the second current source $I_{CMB2}$ and to the gate of the tail transistor $M_{N0}$ at node F. The common-mode control circuit 306B generates a voltage at the node F for control of biasing current to be sunk from the gain-enhancement stage 104B for control of the common-mode voltage. A second terminal of the second current source $I_{CMB2}$ is coupled to the second voltage GND.

The common-mode control circuit 306 provides a degree of liberty in establishing the DC value for the drain voltages of the input transistors $M_{P1A}$, $M_{P1B}$, $M_{N1A}$, $M_{N1B}$ and the gain-enhancement transistors $M_{P2A}$, $M_{P2B}$, $M_{N2A}$, $M_{N2B}$. In an embodiment comprising the operational amplifier 100 and the common-mode control circuit 306, additional currents $I_{CMA}$, $I_{CMB}$ flowing through resistors $R_{CMA}$, $R_{CMB}$ shift the voltages on nodes A, B, and D, E, up and down, respectively, by the value $I_{CM}R_{CMA}$, $I_{CM}R_{CMB}$, which reduces the drain-source headroom on the input devices $M_{N1A}$, $M_{N1B}$ and $M_{P1A}$, $M_{P1B}$ and increases the drain-source headroom on the gain-enhancement devices $M_{P2A}$, $M_{P2B}$ and $M_{N2A}$, $M_{N2B}$, respectively. This level shift on nodes A, B, D, E also produces an increase in the quiescent currents through the output transistors $M_{P3A}$, $M_{P3B}$ and $M_{N3A}$, $M_{N3B}$, which can be compensated, in an embodiment, by reducing the W/L ratios of output transistors $M_{P3A}$, $M_{P3B}$ and $M_{N3A}$, $M_{N3B}$.

Figure 4:
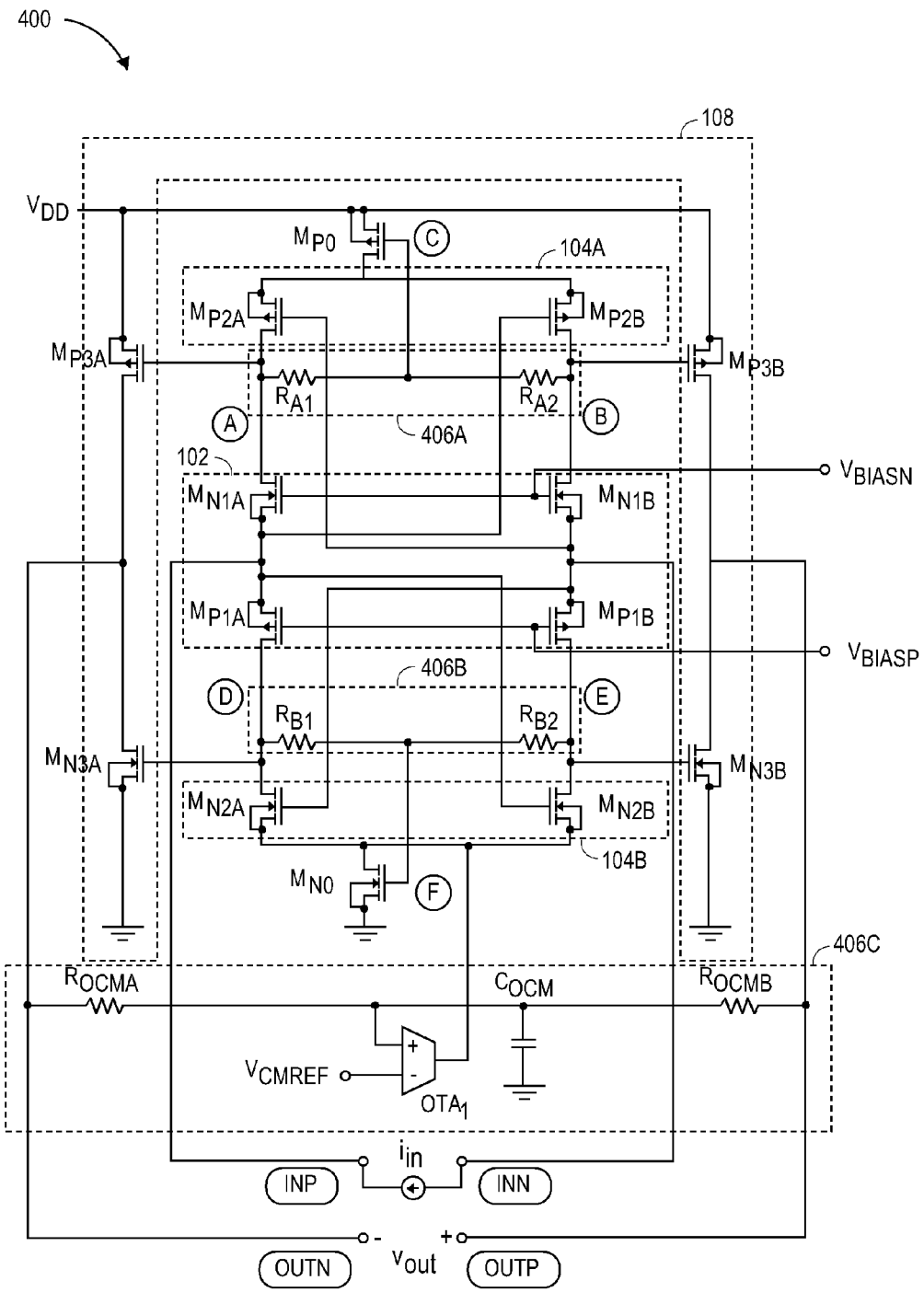
FIG. 4 is a schematic diagram illustrating a CMOS current-feedback operational amplifier comprising an output common-mode feedback loop, according to certain embodiments.

FIG. 4 is a schematic diagram illustrating a current-feedback operational amplifier 400 using an output common-mode feedback loop to control the output common-mode voltage. The current-feedback operational amplifier 400 comprises the input ports INP and INN, the output ports OUTN and OUTP, the input stage 102, the two complementary gain-enhancement stages 104A, 104B, the pseudo-differential output stage 108, and the tail transistors $M_{P0}$, $M_{N0}$, as described above with respect to FIGS. 1 and 2. The operational amplifier 400 further comprises two complementary common-mode control circuits 406A, 406B, where each common-mode control circuit 406A, 406B comprises the two resistors $R_{A1}$, $R_{A2}$ and $R_{B1}$, $R_{B2}$, respectively, as described above with respect to FIG. 2.

The operational amplifier 400 further comprises common-mode control circuit 406C comprising resistors $R_{OCMA}$, $R_{OCMB}$ coupled in series, optional loop capacitance $C_{OCM}$ for ensuring the stability of the control circuit, and a high-gain, low-frequency operational transconductance amplifier $OTA_1$. A first end of resistor $R_{OCMA}$ is coupled to the inverting output port OUTN and a first end of resistor $R_{OCMB}$ is coupled to the non-inverting output port OUTP. The common-node of the series resistors $R_{OCMA}$, $R_{OCMB}$ is coupled to a non-inverting input of amplifier $OTA_1$ and to a first input of the capacitor $C_{OCM}$. A second end of the capacitor $C_{OCM}$ is coupled to the second voltage GND. A common-mode reference voltage $V_{CMREF}$ is coupled to an inverting input of the amplifier $OTA_1$, and an output of the of amplifier $OTA_1$ is coupled to drain of the tail transistor $M_{N0}$.

When voltage $V_{CMREF}$ is set at a value, such as $V_{DD}/2$, for relatively good headroom for both output transistors, the actual output common-mode voltage can be sensed at the common connection point of resistors $R_{OCMA}$, $R_{OCMB}$ and applied to the non-inverting input of operational transconductance amplifier $OTA_1$. The operational transconductance amplifier $OTA_1$ produces an output DC current that is superimposed on the DC drain current of the tail transistor $M_{N0}$, closing a negative feedback loop through transistors $M_{N2A}$, $M_{N2B}$ and $M_{N3A}$, $M_{N3B}$. When the gain of the operational transconductance amplifier $OTA_1$ is sufficiently high, the voltage at the common connection point of resistors $R_{OCMA}$, $R_{OCMB}$ becomes practically or approximately equal to $V_{CMREF}$, thus setting the output common-mode of the amplifier 400 at this level. In another embodiment, a similar negative feedback loop can be built around tail transistor $M_{P0}$ in lieu of tail transistor $M_{N0}$.

Figure 5:
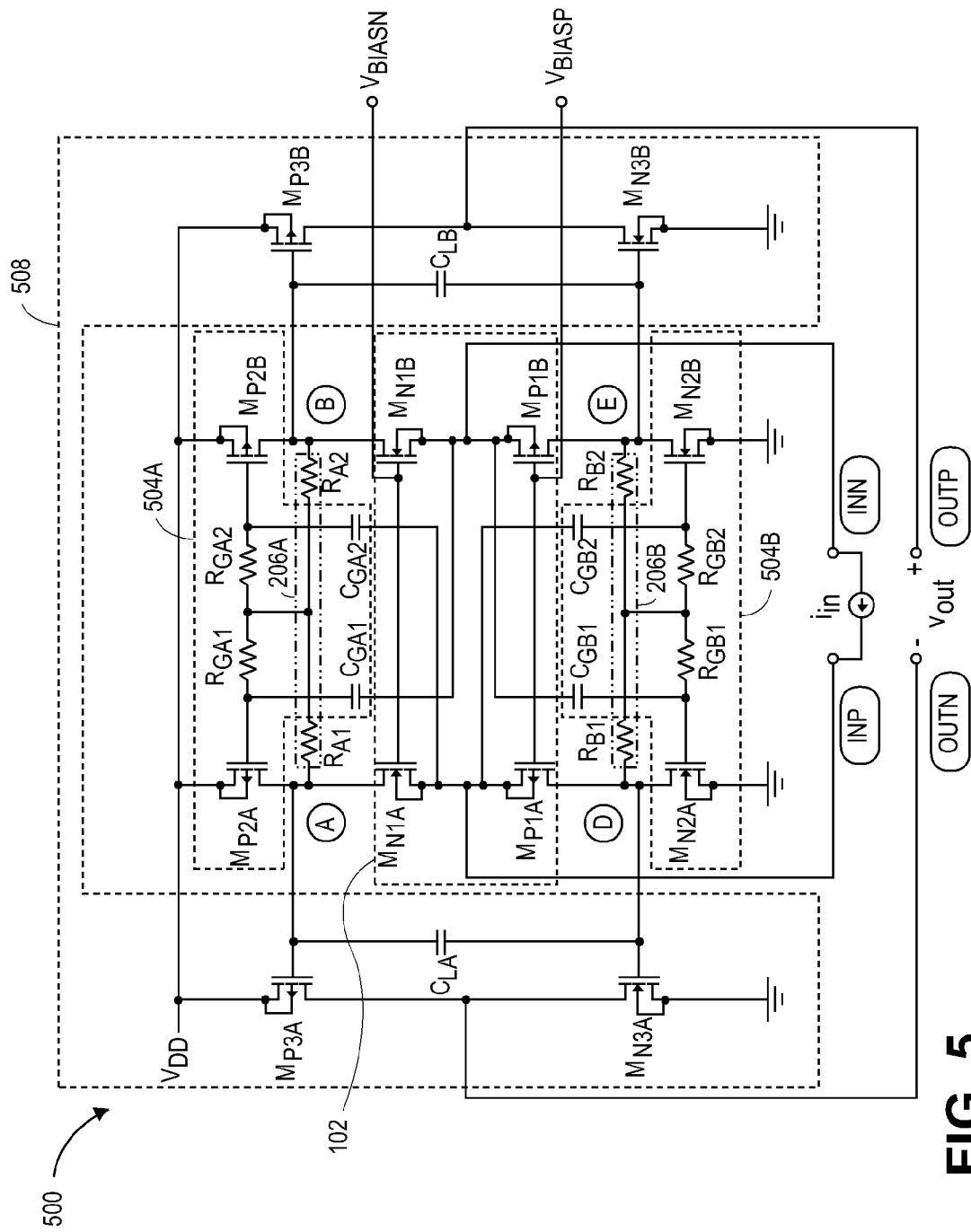
FIG. 5 is a schematic diagram illustrating a CMOS current-feedback operational amplifier comprising AC-coupled gain-enhancement stages, according to certain embodiments.

FIG. 5 is a schematic diagram illustrating a current-feedback operational amplifier 500 using AC-coupling of the gain-enhancement devices $M_{P2A}$, $M_{P2B}$, $M_{N2A}$, $M_{N2B}$ with additional gate resistors and coupling capacitors. The operational amplifier 500 comprises the input ports INP and INN, the output ports OUTN and OUTP, the input stage 102, and the two complementary common-mode control circuits 206A, 206B, as described above in FIGS. 1 and 2.

The operational amplifier 500 further comprises a pseudo-differential output stage 508 comprising two inverters where a first inverter includes transistors $M_{P3A}$ and $M_{N3A}$, and a second inverter includes transistors $M_{P3B}$ and $M_{N3B}$. Output transistors $M_{P3A}$, $M_{N3A}$, and $M_{P3B}$, $M_{N3B}$ are connected as described above with respect to FIG. 1. The pseudo-differential output stage 508 further comprises two capacitors $C_{LA}$, $C_{LB}$ where a first end of capacitor $C_{LA}$ is coupled to the gate of output transistor $M_{P3A}$, a second end of the capacitor $C_{LA}$ is coupled to the gate of output transistor $M_{N3A}$, a first end of capacitor $C_{LB}$ is coupled to the gate of output transistor $M_{P3B}$, and a second end of the capacitor $C_{LB}$ is coupled to the gate of output transistor $M_{N3B}$.

The operational amplifier 500 further comprises two complementary gain-enhancement stages 504A, 504B comprising transistors $M_{P2A}$, $M_{P2B}$ and $M_{N2A}$, $M_{N2B}$, respectively. Each gain-enhancement stage 504A, 504B further comprises two gate resistors $R_{GA1}$, $R_{GA2}$ and $R_{GB1}$, $R_{GB2}$ and two coupling capacitors $C_{GA1}$, $C_{GA2}$ and $C_{GB1}$, $C_{GB2}$, respectively.

In the gain-enhancement stage 504A, the source and body of transistor $M_{P2A}$ and the source and body of transistor $M_{P2B}$ couple to the first voltage $V_{DD}$. The gate of transistor $M_{P2A}$ is coupled to a first end of resistor $R_{GA1}$ and to a first end of capacitor $C_{GA1}$, and the gate of transistor $M_{P2B}$ is coupled to a first end of resistor $R_{GA2}$ and to a first end of capacitor $C_{GA2}$. A second end of resistor $R_{GA1}$ is coupled to a second end of resistor $R_{GA2}$ and to the common-node of series resistors $R_{A1}$, $R_{A2}$ in the common-mode control circuit 206A. A second end of capacitor $C_{GA1}$ is coupled to the source and body of input transistor $M_{N1B}$, to the source and body of input transistor $M_{P1B}$, to the inverting input port INN, and to a first end of capacitor $C_{GB1}$ in the gain-enhancement stage 504B. A second end of capacitor $C_{GA2}$ is coupled to the source and body of input transistor $M_{N1A}$, to the source and body of input transistor $M_{P1A}$, to the non-inverting input port INP, and to a first end of capacitor $C_{GB2}$ in the gain-enhancement stage 504B.

In a similar but complementary manner, in the gain-enhancement stage 504A, the source and body of transistor $M_{N2A}$ and the source and body of transistor $M_{N2B}$ couple to the second voltage GND. The gate of transistor $M_{N2A}$ is coupled to a first end of resistor $R_{GB1}$ and to a second end of capacitor $C_{GB1}$, and the gate of transistor $M_{N2B}$ is coupled to a first end of resistor $R_{GB2}$ and to a second end of capacitor $C_{GB2}$. A second end of resistor $R_{GB1}$ is coupled to a second end of resistor $R_{GB2}$ and to the common-node of series resistors $R_{B1}$, $R_{B2}$ in the common-mode control circuit 206B. As described above, the first end of capacitor $C_{GB1}$ is coupled to the source and body of input transistor $M_{N1B}$, to the source and body of input transistor $M_{P1B}$, to the inverting input port INN, and to the second end of capacitor $C_{GA1}$ in the gain-enhancement stage 504A. Also as described above, the first end of capacitor $C_{GB2}$ is coupled to the source and body of input transistor $M_{N1A}$, to the source and body of input transistor $M_{P1A}$, to the non-inverting input port INP, and to the second end of capacitor $C_{GA2}$ in the gain-enhancement stage 504A.

Because of the absence of or negligible gate currents in technologies such as 65 nm CMOS, for example, resistors $R_{GA1}$, $R_{GA2}$ and $R_{GB1}$, $R_{GB2}$ can be on the order of several tens of KΩ and, at the same time, capacitors $C_{GA1}$, $C_{GA2}$ and $C_{GB1}$, $C_{GB2}$ can be on the order of 1 pF each without taking up a relatively large die area. In an embodiment, the value of resistors $R_{GA1}$, $R_{GA2}$ and $R_{GB1}$, $R_{GB2}$ can be approximately 10 KΩ to approximately 100 KΩ. In another embodiment, the value of capacitors $C_{GA1}$, $C_{GA2}$ and $C_{GB1}$, $C_{GB2}$ can be approximately 1 pF to approximately 10 pF.

In this way, the gain-enhancing effect takes place above moderate frequencies (i.e., above $1/[2\pi R_G C_G]$). This translates into frequencies of several MHz for the exemplary values, which is extremely desirable, since it is in the high-frequency range that amplifier gain degradation occurs. For example, the gain-enhancing effect for the operational amplifier 500 can occur at approximately 1 MHz to approximately 2000 MHz.

In addition, using a variety of transistors with different characteristics and threshold voltages, the AC-coupling permits amplifier operation with relatively large internal voltages and permits operation relatively far from transistor triode region as compared to the operational amplifiers 100, 200, 400 of FIGS. 1, 2, 4, respectively. This aspect can be useful in highly-linear, low-distortion operation in high-frequency, closed-loop applications.

Another important aspect in low distortion applications is the symmetrical drive of output inverters $M_{P3A}$–$M_{N3A}$, $M_{P3B}$–$M_{N3B}$, especially at high frequencies, which is provided by the capacitors $C_{LA}$, $C_{LB}$, respectively. In an embodiment, the value of the capacitors $C_{LA}$, $C_{LB}$ is on the order of a few pF, such as between approximately 1 pF and approximately 10 pF, for an effective short at frequencies above several MHz, such as between approximately 10 MHz and approximately 2000 MHz. In the absence of the capacitors $C_{LA}$, $C_{LB}$, the output inverters are driven by voltages $v_A$, $v_B$, $v_D$, $v_E$ of Equations (1) and (2) in a potentially asymmetric fashion (i.e., $[v_A = -v_B] \neq [v_D = -v_E]$), primarily because of differences in $g_{dsN1}$, $g_{dsN2}$, $g_{dsP1}$, $g_{dsP2}$. Capacitors $C_{LA}$, $C_{LB}$ force the node voltages at A, D and B, E, respectively, to be equal or approximately equal above moderate frequencies, such that:

$$v_A = -v_B = v_D = -v_E = \frac{i_{in}\left(1 + \frac{g_{mP2} + g_{mN2}}{2g_{mN1}}\right)}{\frac{2}{R} + g_{dsN1} + g_{dsN2} + g_{dsP1} + g_{dsP2}}. \quad (4)$$

The transimpedance open-loop gain of the operational amplifier 500 in FIG. 5 above moderate frequencies of several MHz, such as approximately 10 MHz to approximately 100 MHZ, ignoring device capacitances or other parasitics, is:

$$a_z = \frac{2(g_{mP3} + g_{mN3})}{\frac{2}{R_{LOAD}} + g_{dsP3} + g_{dsN3}} \times \frac{1 + \frac{g_{mP2} + g_{mN2}}{2g_{mN1}}}{\frac{2}{R} + g_{dsN1} + g_{dsN2} + g_{dsP1} + g_{dsP2}}, \quad (5)$$

where a hypothetical load resistance $R_{LOAD}$ is assumed to be connected between the output ports OUTN and OUTP. The numerator term $$\frac{g_{mP2} + g_{mN2}}{2g_{mN1}}$$

is the contribution from the gain-enhancing stages 504A, 504B, producing an approximate 6 dB gain increase if devices are scaled such that $g_{mP2}=g_{mN2}=g_{mN1}$, as discussed above with respect to FIG. 2.

If R (RA1, RA2, RB1, RB2) and RLOAD are sufficiently small and the terms $$\frac{2}{R_{LOAD}}, \frac{2}{R}$$

dominate in their respective denominators, assuming that gmP2=gmN2=gmN1, Equation (5) simplifies to:

$$a_z = R \times R_{LOAD} \times (g_{mP3} + g_{mN3}). \quad (6)$$

In closed-loop operation with resistive negative feedback at DC, operational amplifier 500 of FIG. 5 does not need an output common-mode loop as in the operational amplifier 400 of FIG. 4. In FIG. 5, the DC drain currents of gain-enhancement transistors $M_{P2A}$, $M_{P2B}$ and $M_{N2A}$, $M_{N2B}$ are scaled versions of the DC drain currents through the input devices $M_{N1A}$, $M_{N1B}$ and $M_{P1A}$, $M_{P1B}$, and any output common-mode deviation from the input common-mode voltage, such as, for example, a DC voltage of the $M_{N1A}$, $M_{N1B}$ or $M_{P1A}$, $M_{P1B}$ source terminal transistors triggers a DC correction through the transistors of the amplifier 500.

Figure 6:
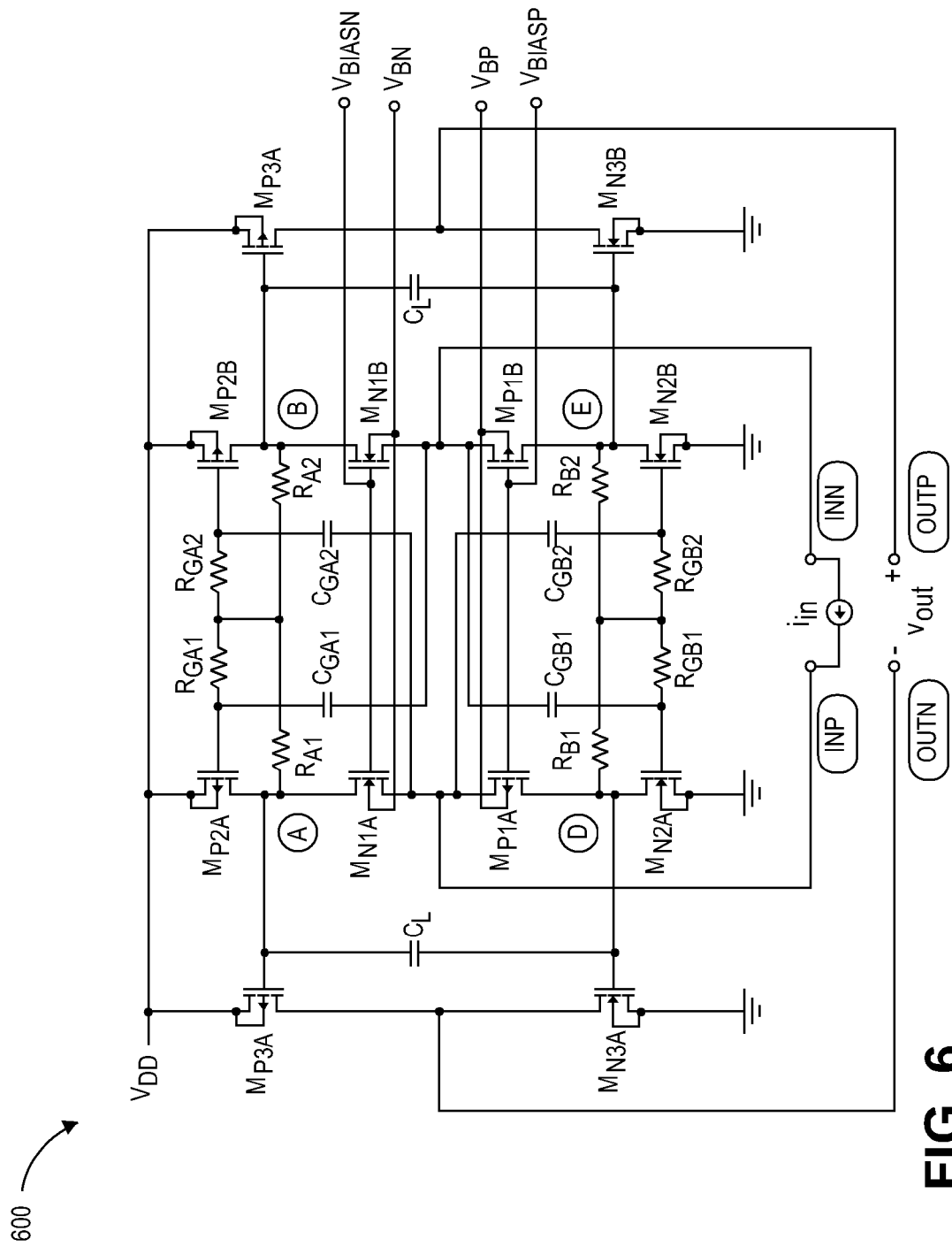
FIG. 6 is a schematic diagram illustrating a CMOS current-feedback operational amplifier comprising AC-coupled gain-enhancement stages and forward body bias for the input transistors, according to certain embodiments.

FIG. 6 is a schematic diagram illustrating a current-feedback operational amplifier 600 using forward body bias voltages $V_{BN}$, $V_{BP}$ to bias input transistors $M_{N1A}$, $M_{N1B}$ and $M_{P1A}$, $M_{P1B}$, respectively, to reduce their threshold voltages in low-voltage applications. Operational amplifier 600 is similar to operational amplifier 500 except that the body diodes of input transistors $M_{N1A}$ and $M_{N1B}$ connect to the forward body bias voltage $V_{BN}$, and the body diodes of input transistors $M_{P1A}$ and $M_{P1B}$ connect to the forward body bias voltage $V_{BP}$.

Figure 7:
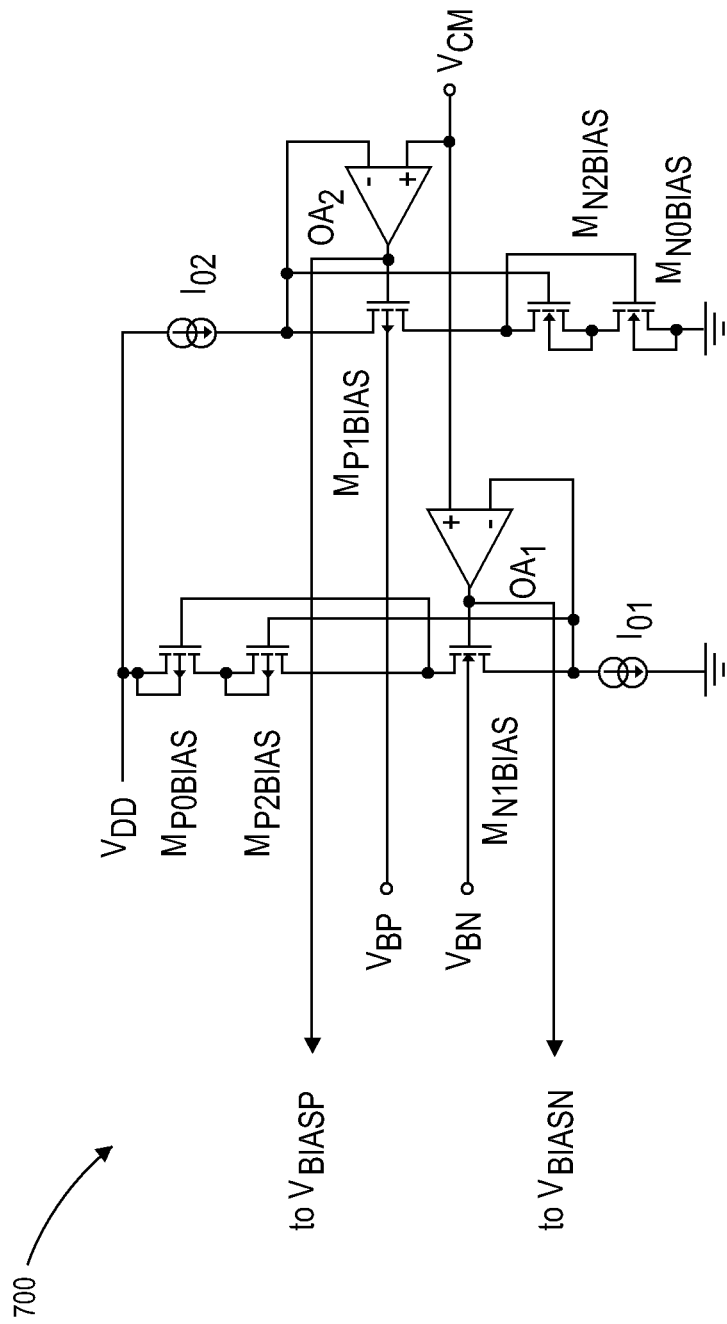
FIG. 7 is a schematic diagram illustrating a CMOS bias circuit to generate bias voltages used by embodiments of the CMOS current-feedback operational amplifier, according to certain embodiments.

FIG. 7 is a schematic diagram illustrating a bias circuit 700 to generate bias voltages $V_{BIASN}$ and $V_{BIASP}$ used by embodiments of current-feedback operational amplifiers 200, 400. The bias circuit 700 comprises low-frequency, high-gain operational amplifiers $OA_1$ and $OA_2$, reference current sources $I_{01}$, $I_{02}$, input-replica transistors $M_{N1BIAS}$ and $M_{P1BIAS}$ which comprise replicas of input transistors $M_{N1A}$, $M_{N1B}$ and $M_{P1A}$, $M_{P1B}$, respectively, gain-enhancement-replica transistors $M_{P2BIAS}$ and $M_{N2BIAS}$ which comprise replicas of gain-enhancement transistors $M_{P2A}$, $M_{P2B}$ and $M_{N2A}$, $M_{N2B}$, respectively, and tail-replica transistors $M_{P0BIAS}$ and $M_{N0BIAS}$ comprise half-sized replicas of tail transistors $M_{P0}$ and $M_{N0}$, respectively, in FIGS. 2 and 4. In one embodiment, the transistors $M_{P2BIAS}$ and $M_{N2BIAS}$ are configured to be turned on and operate in the same conditions (i.e., with same terminal voltages) as their $M_{P2}$ and $M_{N2}$ counterparts in FIGS. 2 and 4. The gate and source of each of the transistors $M_{P0BIAS}$ and $M_{N0BIAS}$ are diode-connected via the drain and source of the transistors $M_{P2BIAS}$ and $M_{N2BIAS}$. The transistors $M_{P0BIAS}$, $M_{P2BIAS}$, $M_{N0BIAS}$, $M_{N2BIAS}$ provide voltage drops to replicate voltage drops of the gain-enhancement transistors $M_{P2A}$, $M_{P2B}$ and $M_{N2A}$, $M_{N2B}$.

A source and body of the tail-replica transistor $M_{P0BIAS}$ couple to the first voltage $V_{DD}$ and a drain of the tail-replica transistor $M_{P0BIAS}$ is coupled to a source and body of the gain-enhancement-replica transistor $M_{P2BIAS}$. A gate of the tail-replica transistor $M_{P0BIAS}$ is coupled to a drain of the input-replica transistor $M_{N1BIAS}$ and to a drain of the gain-enhancement-replica transistor $M_{P2BIAS}$. A gate of the gain-enhancement-replica transistor $M_{P2BIAS}$ is coupled to an inverting input of the operational amplifier $OA_1$, to a first terminal of the reference current source $I_{01}$, and to a source of the input-replica transistor $M_{N1BIAS}$. A second terminal of the reference current source $I_{01}$ is coupled to the second voltage GND. In an embodiment, a body of the input-replica transistor $M_{N1BIAS}$, and the bodies of the input transistors $M_{N1A}$ and $M_{N1B}$ of the amplifiers 200 (FIG. 2), 400 (FIG. 4) can be provided with the body bias voltage $V_{BN}$ to reduce their threshold voltage A non-inverting input of the operational amplifier $OA_1$ is provided with a reference voltage $V_{CM}$, and an output of the operational amplifier $OA_1$ is coupled to a gate of the input-replica transistor $M_{N1BIAS}$ and provides the bias voltage $V_{BIASN}$.

A source and body of the tail-replica transistor $M_{N0BIAS}$ is coupled to the second voltage GND, and a drain of the tail-replica transistor $M_{N0BIAS}$ is coupled to a source and body of the gain-enhancement-replica transistor $M_{N2BIAS}$. A gate of the tail-replica transistor $M_{N0BIAS}$ is coupled to a drain of the input-replica transistor $M_{P1BIAS}$ and to a drain of the gain-enhancement-replica transistor $M_{N2BIAS}$. A gate of the gain-enhancement-replica transistor $M_{N0BIAS}$ is coupled to an inverting input of the operational amplifier $OA_2$, to a first terminal of the reference current source $I_{02}$, and to a source of the input-replica transistor $M_{P1BIAS}$. A second terminal of the reference current source $I_{02}$ is coupled to the first voltage $V_{DD}$. In an embodiment, a body of the input-replica transistor $M_{P1BIAS}$ and the bodies of the input transistors $M_{P1A}$ and $M_{P1B}$ of the amplifiers 200 (FIG. 2), 400 (FIG. 4), respectively, can be provided with the body bias voltage $V_{BP}$ to reduce their threshold voltage. A non-inverting input of the operational amplifier $OA_2$ is provided with the reference voltage $V_{CM}$ as an input, and an output of the operational amplifier $OA_2$ is coupled to a gate of the input-replica transistor $M_{P1BIAS}$ and provides the bias voltage $V_{BIASP}$.

The low-frequency, high-gain operational amplifiers $OA_1$ and $OA_2$ drive the gates of input-replica transistors $M_{N1BIAS}$ and $M_{P1BIAS}$, which are replicas of the input core transistors $M_{N1A}$, $M_{N1B}$, $M_{P1A}$, $M_{P1B}$ of the main amplifier 200, 400. The resulting gate voltages $V_{BIASN}$ and $V_{BIASP}$ are provided to the gates of input core transistors $M_{N1A}$, $M_{N1B}$, and $M_{P1A}$, $M_{P1B}$, respectively, for biasing (FIGS. 1-2 and 4-6). In this way, the transistors in both the bias circuit 700 and the operational amplifier 200, 400 operate with the same or approximately the same headroom voltages, and bias voltages $V_{BIASN}$ and $V_{BIASP}$ generated through the negative-feedback action of $OA_1$ and $OA_2$ ensure replication of currents $I_{01}$, $I_{02}$ through the input branches of the main amplifier 200, 400. The replica transistors $M_{N1BIAS}$ and $M_{P1BIAS}$ and the input core transistors $M_{N1A}$, $M_{N1B}$, $M_{P1A}$, $M_{P1B}$ can have the same scale or can vary via a scale factor with the current correspondingly scaled.

In one embodiment, the bias circuit 700 can provide relatively large and constant headroom voltages for the reference current sources $I_{O1}$, $I_{O2}$, which allows selecting these currents with a relatively good degree of accuracy. Reference voltage $V_{CM}$ in FIG. 7 establishes the input common-mode voltage. In an embodiment, the reference voltage $V_{CM}$ is set to $V_{DD}/2$, which, via operation of the feedback loops, sets the voltages $V_{BIASN}$ and $V_{BIASP}$ to one transistor $V_{GS}$ voltage above and below $V_{DD}/2$ such that the input common-mode voltage is approximately $V_{DD}/2$.

Figure 8:
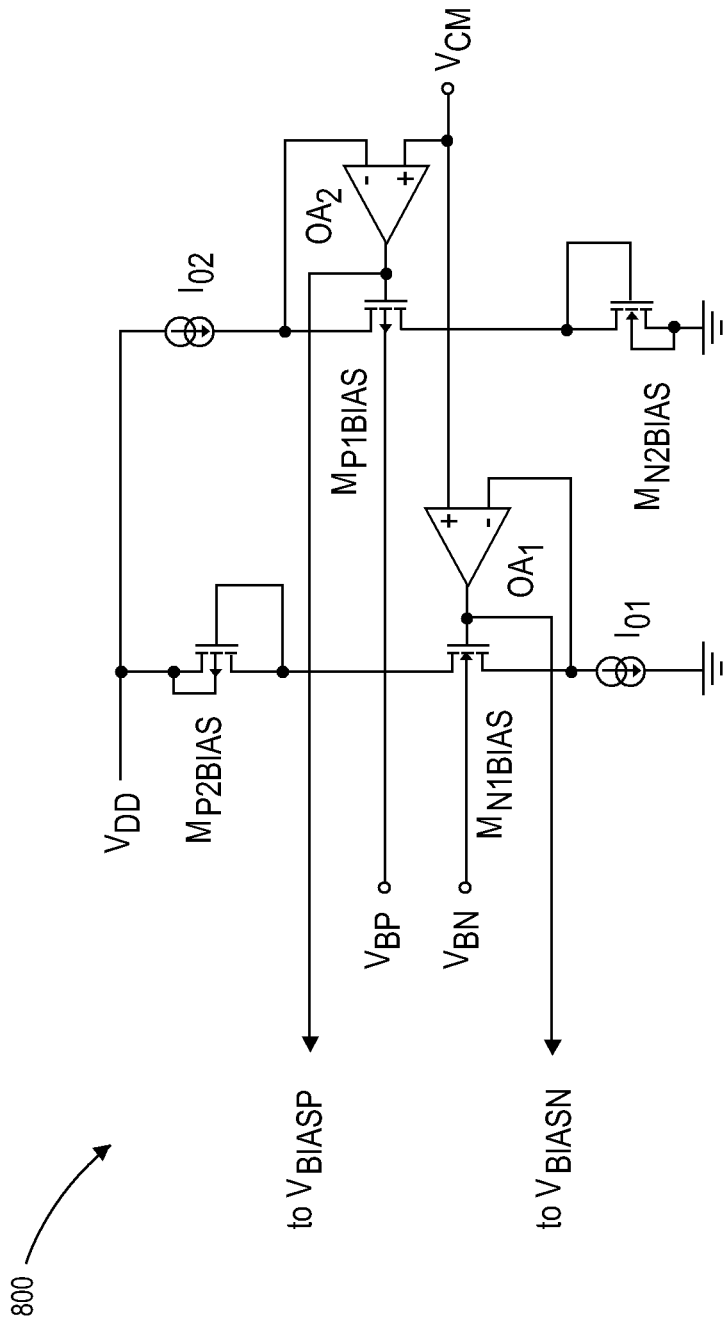
FIG. 8 is a schematic diagram illustrating another CMOS bias circuit to generate bias voltages used by embodiments of the CMOS current-feedback operational amplifier, according to certain embodiments.

FIG. 8 is a schematic diagram illustrating a bias circuit 800 to generate bias voltages $V_{BIASN}$ and $V_{BIASP}$ used by embodiments of current-feedback operational amplifiers 500, 600 in FIGS. 5 and 6, respectively. The bias circuit 800 comprises the low-frequency, high-gain operational amplifiers $OA_1$ and $OA_2$, the reference current sources $I_{O1}$, $I_{O2}$, the input-replica transistors $M_{N1BIAS}$ and $M_{P1BIAS}$ which comprise replicas of input transistors $M_{N1A}$, $M_{N1B}$ and $M_{P1A}$, $M_{P1B}$, respectively, gain-enhancement-replica transistors $M_{P2BIAS}$ and $M_{N2BIAS}$ which comprise replicas of gain-enhancement transistors $M_{P2A}$, $M_{P2B}$ and $M_{N2A}$, $M_{N2B}$, respectively, in amplifiers 500, 600.

The source and body of the gain-enhancement-replica transistor $M_{P2BIAS}$ couple to the first voltage $V_{DD}$, and the drain and gate of the gain-enhancement-replica transistor $M_{P2BIAS}$ couple to the drain of the input-replica transistor $M_{N1BIAS}$. The source of the input-replica transistor $M_{N1BIAS}$ is coupled to an inverting input of the operational amplifier $OA_1$ and to a first terminal of the reference current source $I_{O1}$. A second terminal of the reference current source $I_{O1}$ is coupled to the second voltage GND. In an embodiment, a body of the input-replica transistor $M_{N1BIAS}$ and the bodies of the input transistors $M_{N1A}$ and $M_{N1B}$ of the amplifier 500 (FIG. 5) can be provided with the body bias voltage $V_{BN}$ to reduce their threshold voltage. In another embodiment, as illustrated in FIGS. 6 and 8, the body of the input-replica transistor $M_{N1BIAS}$ and the bodies of the input transistors $M_{N1A}$ and $M_{N1B}$ of the amplifier 600 are provided with the body bias voltage $V_{BN}$ to reduce their threshold voltage. A non-inverting input of the operational amplifier $OA_1$ is coupled to a reference voltage $V_{CM}$, and an output of the operational amplifier $OA_1$ is coupled to the gate of the input-replica transistor $M_{N1BIAS}$ and provides the bias voltage $V_{BIASN}$.

The source and body of the gain-enhancement-replica transistor $M_{N2BIAS}$ couple to the second voltage GND, and the drain and gate of the gain-enhancement-replica transistor $M_{N2BIAS}$ couple to the drain of the input-replica transistor $M_{P1BIAS}$. The source of the input-replica transistor $M_{P1BIAS}$ is coupled to an inverting input of the operational amplifier $OA_2$ and to the first terminal of the reference current source $I_{O2}$. The second terminal of the reference current source $I_{O2}$ is coupled to the first voltage $V_{DD}$. In an embodiment, a body of the input-replica transistor $M_{P1BIAS}$ and the bodies of the input transistors $M_{P1A}$ and $M_{P1B}$ of the amplifier 500 (FIG. 5) can be provided with the body bias voltage $V_{BP}$. In another embodiment, as illustrated in FIGS. 6 and 8, the body of the input-replica transistor $M_{P1BIAS}$ and the bodies of the input transistors $M_{P1A}$ and $M_{P1B}$ of the amplifier 600 are provided with the body bias voltage $V_{BN}$ to reduce their threshold voltage. A non-inverting input of the operational amplifier $OA_2$ is coupled to the reference voltage $V_{CM}$, and the output of the operational amplifier $OA_2$ is coupled to the gate of the input-replica transistor $M_{P1BIAS}$ and provides the bias voltage $V_{BIASP}$.

The drain circuits of devices $M_{N1BIAS}$ and $M_{P1BIAS}$ replicate the input branches in the operational amplifier 500, 600 and the operation is similar to the operation of the bias circuit 700 in FIG. 7.

Figure 9:
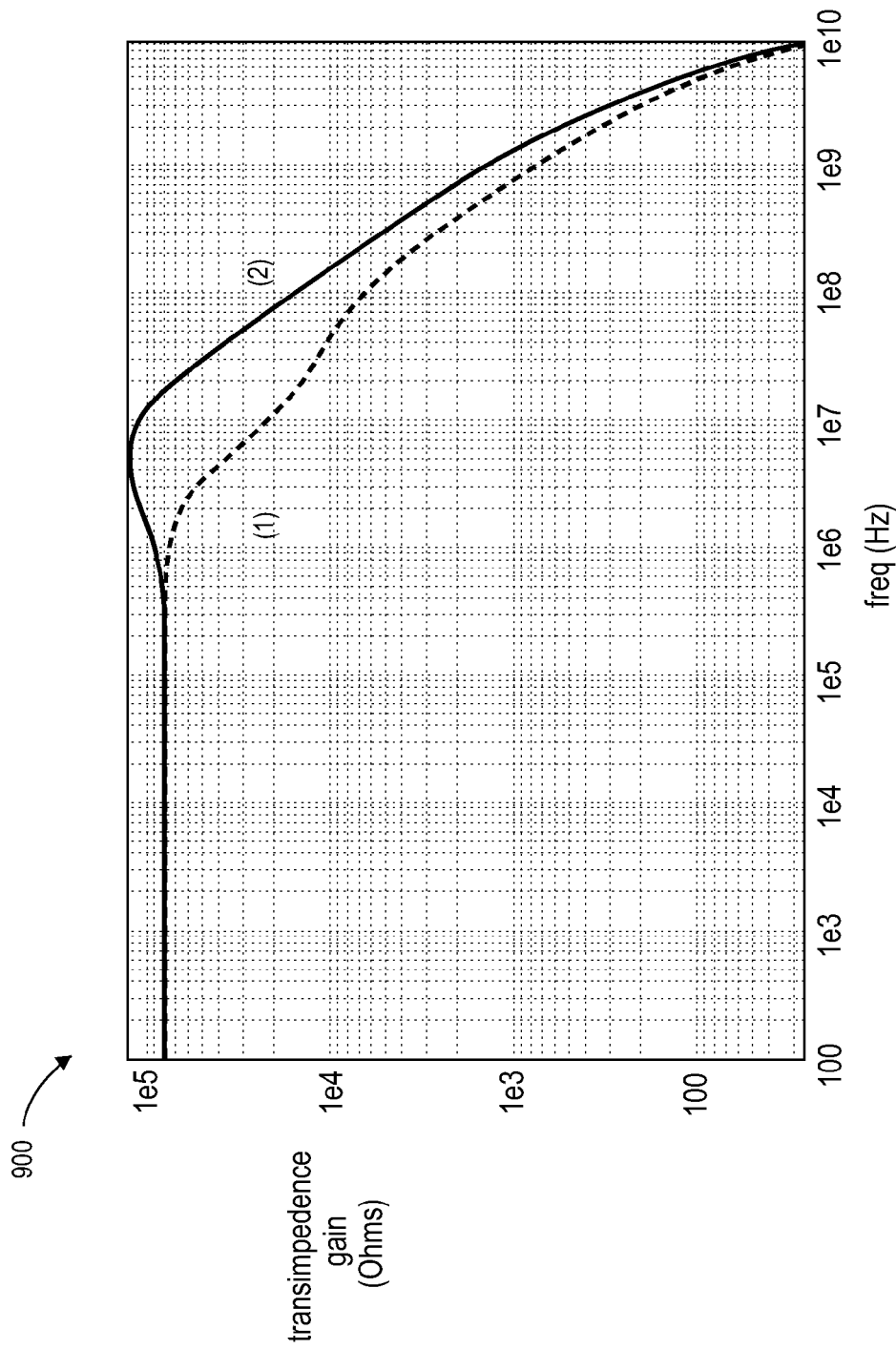
FIG. 9 is an exemplary plot comparing typical open-loop transimpedance gain of the current-feedback operational amplifier with and without gain enhancement.

FIG. 9 shows a comparative computer simulation plot 900 comparing typical open-loop transimpedance gain with and without gain enhancement. The current-feedback operational amplifier 600 of FIG. 6 using the bias circuit 800 of FIG. 8 implemented in a 65 nm CMOS process, using approximately $V_{DD}=1.2$ V, $V_{CM}=0.5V_{DD}$, $V_{BN}=0.75V_{DD}$, and $V_{BP}=0.25V_{DD}$ was used for the plot. The y-axis indicates the transimpedance gain in ohms and the x-axis indicates the frequency in hertz. Curve 1 illustrates the open-loop transimpedance gain without the gain-enhancing feature provided by coupling capacitors $C_{GA1}$, $C_{GA2}$, $C_{GB1}$, $C_{GB2}$ present in the operational amplifier 600 and Curve 2 illustrates the open-loop transimpedance gain with the gain-enhancing feature provided by coupling capacitors $C_G$ ($C_{GA1}$, $C_{GA2}$, $C_{GB1}$, $C_{GB2}$)=1 pF present. The plot 900 shows the improvement provided by the gain-enhancement described above at moderate and high frequencies, such as frequencies above approximately 700 kHz.

Figure 10:
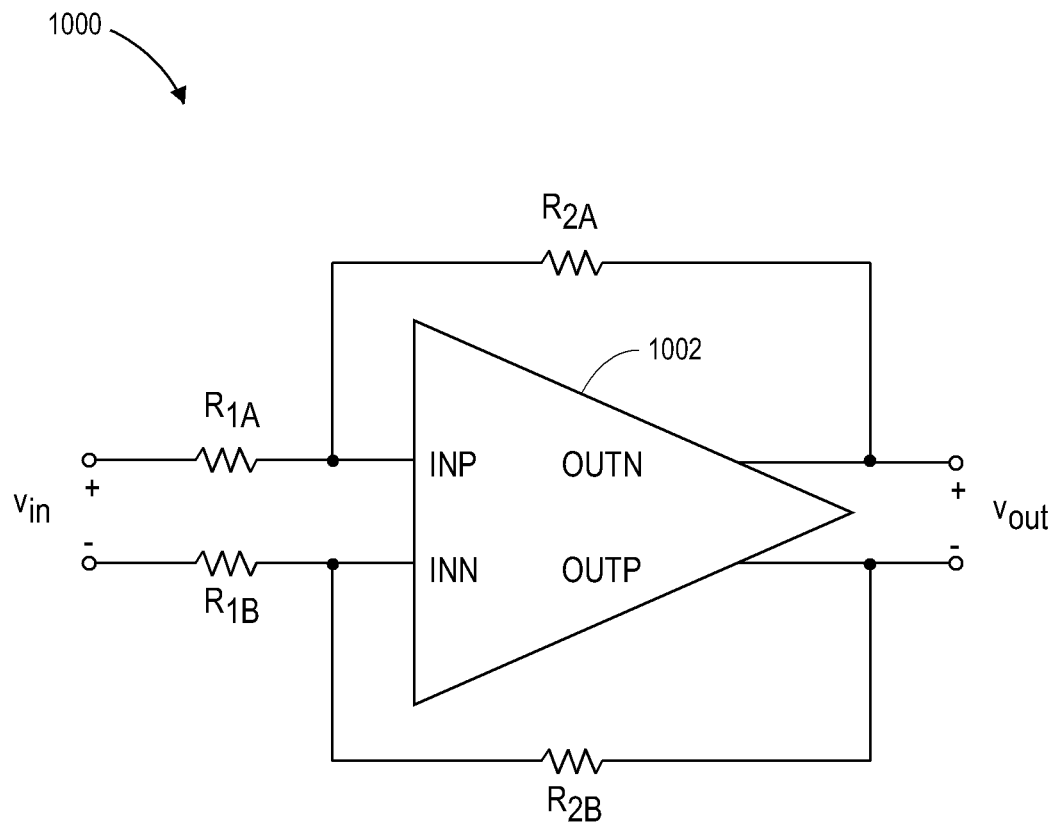
FIG. 10 is a schematic diagram illustrating the current-feedback operational amplifier in a closed-loop, voltage-amplifier configuration, according to certain embodiments.

FIG. 10 illustrates a closed-loop, voltage-amplifier configuration 1000 of a current-feedback operational amplifier 1002. The configuration 1000 comprises input nodes $v_{IN+}$ and $v_{IN-}$ and output nodes $v_{OUT+}$ and $v_{OUT-}$ and the operational amplifier 1002 comprises non-inverting and inverting input ports INP and INN and inverting and non-inverting output ports OUTN and OUTP. The configuration 1000 further comprises two input resistors $R_{1A}$, $R_{1B}$ and two feedback resistors $R_{2A}$, $R_{2B}$ configured such that $R_{1A}$ is coupled in series between the input node $v_{in+}$ and the non-inverting input port INP, $R_{2A}$ is coupled in series between the output node $v_{OUT+}$ and the non-inverting input port INP in a first feedback loop, $R_{1B}$ is coupled in series between the input node $v_{IN-}$ and the inverting input port INN, and $R_{2b}$ is coupled in series between the output node $v_{OUT-}$ and the inverting input port INN in a second feedback loop.

Figure 11:
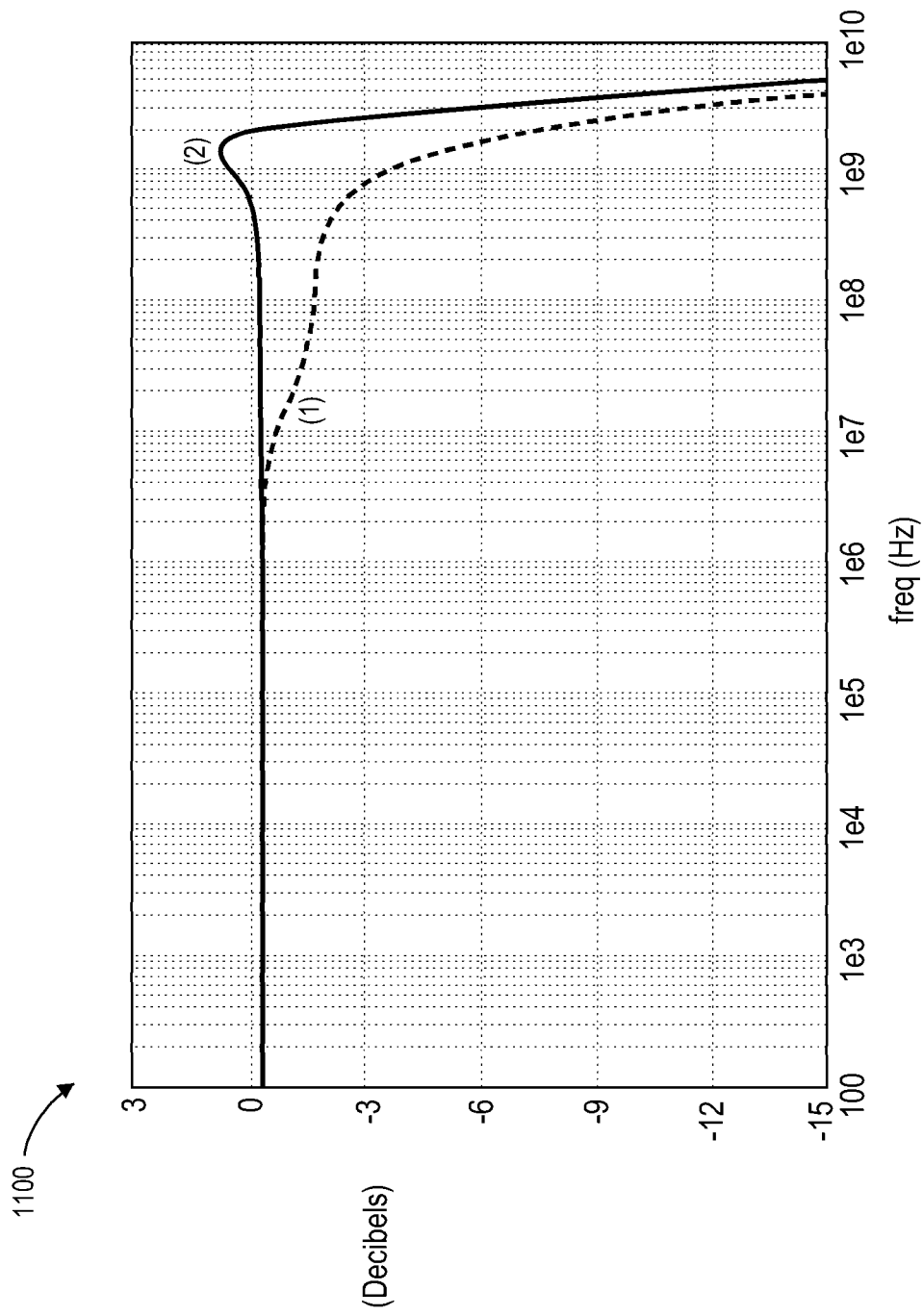
FIG. 11 is an exemplary plot comparing the typical gain of the current-feedback amplifier in a low-gain, closed-loop configuration with and without gain enhancement.
Figure 12:
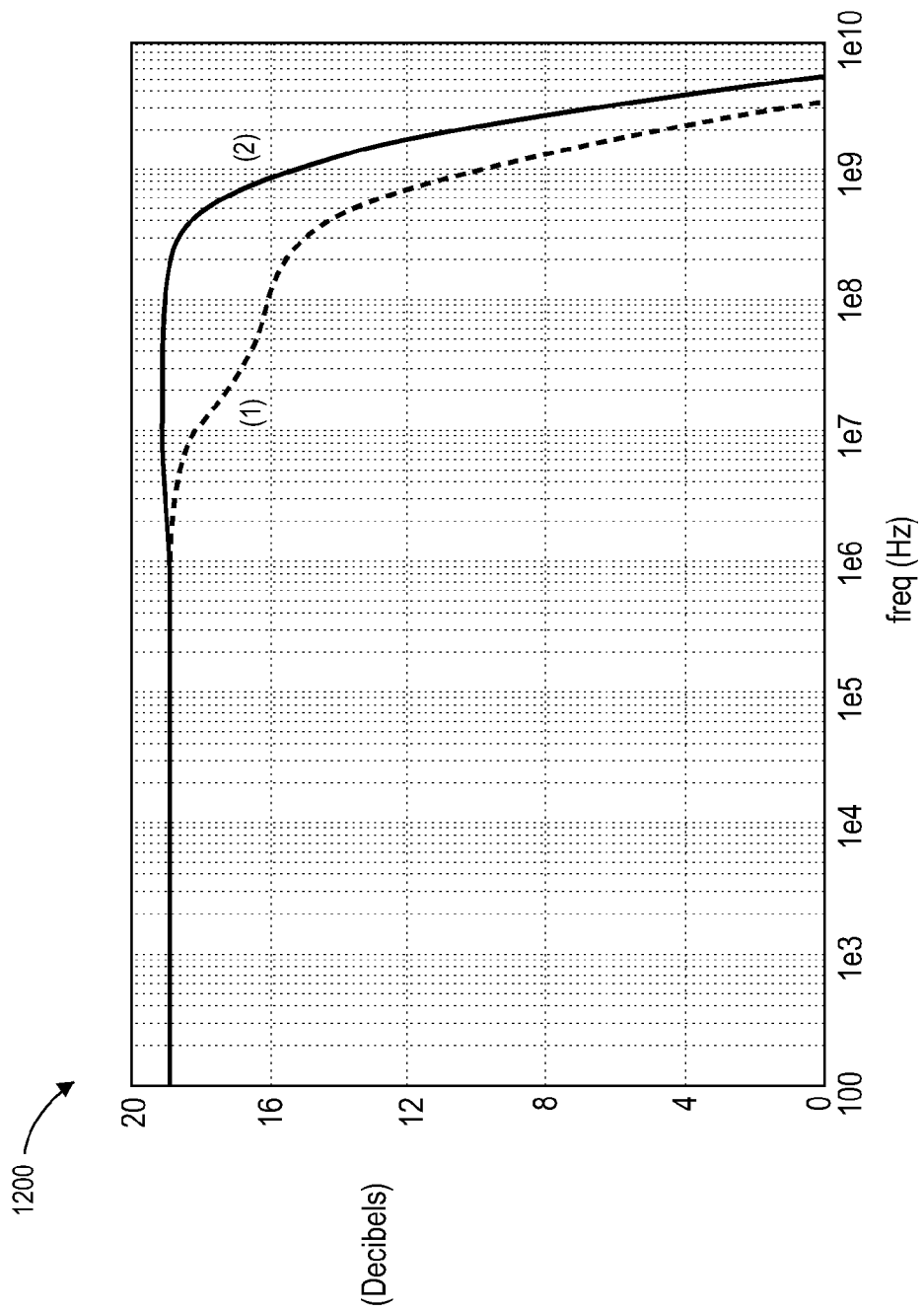
FIG. 12 is an exemplary plot comparing the typical gain of the current-feedback amplifier in a high-gain, closed-loop configuration with and without gain enhancement.

FIGS. 11 and 12 illustrate comparative computer simulation plots 1100, 1200 of typical closed-loop gains of the current-feedback operational amplifier 1002 connected as shown in FIG. 10 with and without gain enhancement provided by coupling capacitors $C_G$. FIG. 11 illustrates the closed-loop gain in a low-gain setup where $R_1=R_2$, and FIG. 12 illustrates the closed-loop gain a high-gain setup where $R_1=R_2/10$. The current-feedback operational amplifier 1002 comprises the current-feedback operational amplifier 600 using the bias circuit 800 implemented in a 65 nm CMOS process, using approximately $V_{DD}=1.2$ V, $V_{CM}=0.5V_{DD}$, $V_{BN}=0.75V_{DD}$, and $V_{BP}=0.25V_{DD}$. The y-axis of the plots indicates the transimpedance gain in dB and the x-axis of the plots indicates the frequency in hertz.

FIG. 11 shows the comparative computer simulation plot 1100 of the typical closed-loop gain in a low-gain configuration where $R_{1A}=R_{1B}=R_{2A}=R_{2B}$=approximately 300Ω. Curve 1 illustrates the closed-loop gain without the gain-enhancing feature provided by coupling capacitors $C_{GA1}$, $C_{GA2}$, $C_{GB1}$, $C_{GB2}$ present and Curve 2 illustrates the closed-loop gain with the gain-enhancing feature provided by coupling capacitors $C_{GA1}$, $C_{GA2}$, $C_{GB1}$, $C_{GB2}$=approximately 1 pF present. The plot 1100 shows the improvement provided by the gain enhancement at high frequencies, such as frequencies above approximately 3 MHz.

FIG. 12 shows a comparative computer simulation plot 1200 of the typical closed-loop gain in a high-gain configuration where $R_{1A}=R_{1B}$=approximately 30Ω and $R_{2A}=R_{2B}$=approximately 300Ω. Curve 1 illustrates the closed-loop gain without the gain-enhancing feature provided by coupling capacitors $C_{GA1}$, $C_{GA2}$, $C_{GB1}$, $C_{GB2}$ present and Curve 2 illustrates the closed-loop gain with the gain-enhancing feature provided by coupling capacitors $C_{GA1}$, $C_{GA2}$, $C_{GB1}$, $C_{GB2}$=approximately 1 pF present. The plot 1200 shows the improvement provided by the gain enhancement at high frequencies, such as frequencies above approximately 1 MHz. Both FIG. 11 (low-gain configuration) and FIG. 12 (high-gain configuration) indicate that the gain-enhancing feature provides a substantial improvement at high frequencies, without additional power consumption.

Figure 13:
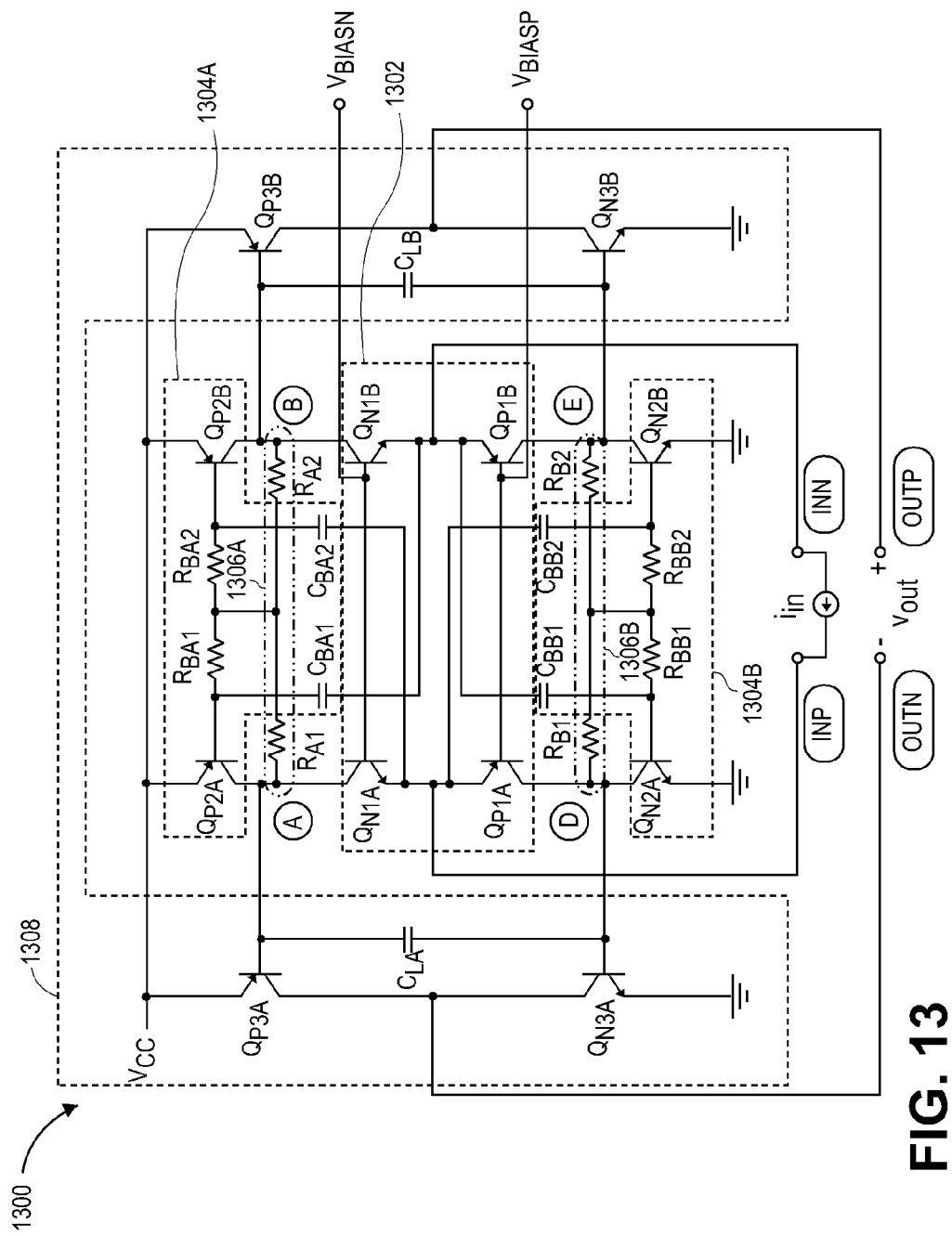
FIG. 13 is a schematic diagram illustrating a differential bipolar current-feedback operational amplifier comprising AC-coupled gain-enhancement stages, according to certain embodiments.

Many variations and alternatives of the described embodiments are possible, including bipolar variants. FIG. 13 illustrates a schematic diagram of a bipolar differential current-feedback operational amplifier 1300. In an embodiment, the current-feedback operational amplifier 1300 comprises a bipolar embodiment of the CMOS current feedback operational amplifier 500.

The operational amplifier 1300 is configured to receive a differential current input $i_{in}$ at the inverting and non-inverting input ports INN, INP, respectively and to generate a differential voltage output signal $V_{out+}$, $V_{out-}$ at the non-inverted and inverted output ports OUTP, OUTN. The operational amplifier 1300 comprises an input stage 1302 comprising transistors $Q_{N1A}$, $Q_{N1B}$, $Q_{P1A}$, $Q_{P1B}$. In the illustrated embodiment, the transistors $Q_{N1A}$, $Q_{N1B}$ are NPN type and the transistors $Q_{P1A}$, $Q_{P1B}$ are PNP type, which are considered complementary to the NPN type.

The operational amplifier 1300 further comprises two complementary gain-enhancement stages 1304A, 1304B comprising transistors $Q_{P2A}$, $Q_{P2B}$ and $Q_{N2A}$, $Q_{N2B}$, respectively. Each gain-enhancement stage 1304A, 1304B further comprises two base resistors $R_{BA1}$, $R_{BA2}$ and $R_{BB1}$, $R_{BB2}$ and two coupling capacitors $C_{BA1}$, $C_{BA2}$ and $C_{BB1}$, $C_{BB2}$, respectively. The operational amplifier 1300 further comprises common-mode control circuits 1306A, 1306B, each comprising resistors $R_{A1}$, $R_{A2}$ and $R_{B1}$, $R_{B2}$, respectively, and a pseudo-differential output stage 1308 comprising transistors $Q_{P3A}$, $Q_{N3A}$, and transistors $Q_{P3B}$, $Q_{N3B}$, and capacitors $C_{LA}$, $C_{LB}$. In an embodiment, the transistors comprise bipolar junction transistors having a base, a collector, and an emitter. The complementary gain-enhancement stages 1304A, 1304B comprise transistors $Q_{P2A}$, $Q_{P2B}$ and $Q_{N2A}$, $Q_{N2B}$, respectively, whose bases are cross-coupled to amplifier inputs INP and INN, and provide additional voltage signals at nodes A, B, D, and E in phase with the voltage signals generated by the input core stage 1302 to provide gain enhancement. In one embodiment, the biasing currents flowing through the gain-enhancement stages 1304A, 1304B are nearly the same as the biasing currents flowing through the input stage 1302, which advantageously saves power.

In the input stage 1302, an emitter of transistor $Q_{N1A}$ is coupled to an emitter of transistor $Q_{P1A}$, to the non-inverting input port INP, to a first end of capacitor $C_{BB2}$, and to a first end of capacitor $C_{BA2}$. An emitter of transistor $Q_{N1B}$ is coupled to an emitter of transistor $Q_{P1B}$, to the inverting input port INN, to a end of capacitor $C_{BB1}$, and to a first end of capacitor $C_{BA1}$. A base of transistor $Q_{P1A}$ is coupled to a base of transistor $Q_{P1B}$ and to the bias voltage $V_{BIASP}$. A base of transistor $Q_{N1A}$ is coupled to a base of transistor $Q_{N1B}$ and to the bias voltage $V_{BIASN}$.

Further in the input stage 102, a collector of transistor $Q_{N1A}$ is coupled to a first end of resistor $R_{A1}$, to a base of output stage transistor to an $Q_{P3A}$, to an emitter of transistor $Q_{P2A}$, and to a first end of capacitor $C_{LA}$. An emitter of transistor $Q_{N1B}$ is coupled to a first end of resistor $R_{A2}$, to a base of output stage transistor $Q_{P3B}$, to a collector of transistor $Q_{P2B}$, and to a first end of capacitor $C_{LB}$. A collector of transistor $Q_{P1A}$ is coupled to a first end of resistor $R_{B1}$, to a base of output stage transistor $Q_{N3A}$, and to a collector of transistor $Q_{N2A}$, and to a second end of capacitor $C_{LA}$. A collector of transistor $Q_{P1B}$ is coupled to a first end of resistor $R_{B2}$, to a base of output stage transistor $Q_{N3B}$, to a collector of transistor $Q_{N2B}$ and to a second end of capacitor $C_{LB}$.

The common-mode control circuit 1306A comprises resistor $R_{A1}$ in series with resistor $R_{A2}$ such that a second end of resistor $R_{A1}$ is coupled to a second end of resistor $R_{A2}$. Similarly, the common-mode control circuit 1306B comprises resistor $R_{B1}$ in series with resistor $R_{B2}$ such that a second end of resistor $R_{B1}$ is coupled to a first end of resistor $R_{B2}$.

In the gain-enhancement stage 1304A, an emitter of transistor $Q_{P2A}$ and an emitter of transistor $Q_{P2B}$ couple to the first voltage $V_{DD}$. The base of transistor $Q_{P2A}$ is coupled to a first end of resistor $R_{BA1}$ and to a second end of capacitor $C_{BA1}$, and a base of transistor $Q_{P2B}$ is coupled to a first end of resistor $R_{BA2}$ and to a second end of capacitor $C_{BA2}$. A second end of resistor $R_{BA1}$ is coupled to a second end of resistor $R_{BA2}$ and to the common-node of the series resistors $R_{A1}$, $R_{A2}$.

In the gain-enhancement stage 1304B, an emitter of transistor $Q_{N2A}$ and an emitter of transistor $Q_{N2B}$ couple to the second voltage GND. The base of transistor $Q_{N2A}$ is coupled to a first end of resistor $R_{BB1}$ and to a second end of capacitor $C_{BB1}$, and a base of transistor $Q_{N2B}$ is coupled to first end s $R_{BB2}$ and to a second end of capacitor $C_{BB2}$. A second end of resistor $R_{BB1}$ is coupled to a second end of resistor $R_{BB2}$ and to the common-node of the series resistors $R_{B1}$, $R_{B2}$.

In the pseudo-differential output stage 1308, an emitter to transistor $Q_{P3A}$ and an emitter of transistor $Q_{P3B}$ couple to the first voltage $V_{DD}$. A collector of transistor $Q_{P3A}$ is coupled to a collector of transistor $Q_{N3A}$, and to the inverting output port OUTN. A collector of transistor $Q_{P3B}$ is coupled to a collector of transistor $Q_{N3B}$, and to the non-inverting output port OUTP. An emitter of transistor $Q_{N3A}$ and an emitter of transistor $Q_{N3B}$ couple to the second voltage GND.

Figure 14:
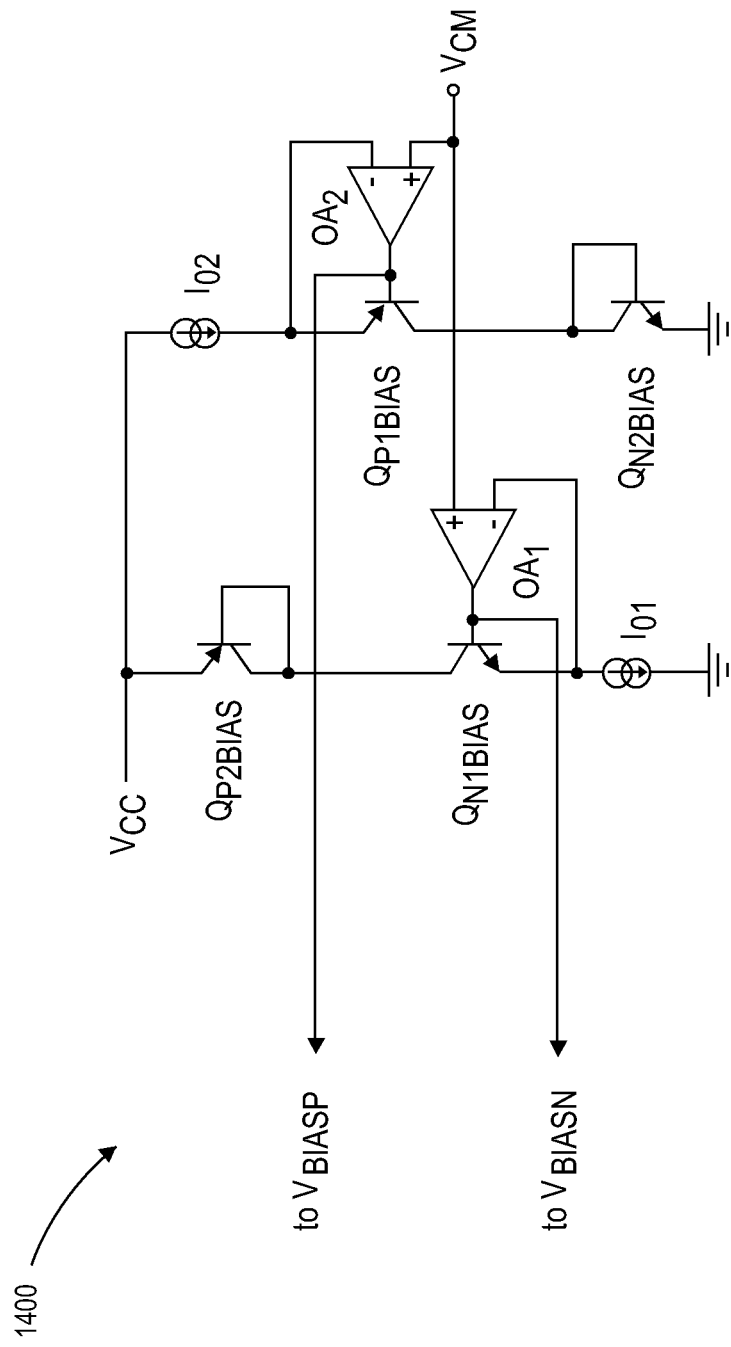
FIG. 14 is a schematic diagram illustrating a bipolar bias circuit to generate bias voltages used by embodiments of the differential bipolar current-feedback operational amplifier, according to certain embodiments.

FIG. 14 is a schematic diagram of a bipolar bias circuit 1400 to generate the bias voltages $V_{BIASN}$ and $V_{BIASP}$ used by the operational amplifier 1300. In an embodiment, the bias circuit 1400 comprises a bipolar embodiment of the CMOS bias circuit 800 which generates the bias voltages $V_{BIASN}$ and $V_{BIASP}$ for the operational amplifier 500.

FIG. 14 comprises the low-frequency, high-gain operational amplifiers $OA_1$ and $OA_2$, the reference current sources $I_{01}$, $I_{02}$, input-replica transistors $Q_{N1BIAS}$ and $Q_{P1BIAS}$ which comprise replicas of input transistors $Q_{N1A}$, $Q_{N1B}$ and $Q_{P1A}$, $Q_{P1B}$, respectively, gain-enhancement-replica transistors $Q_{P2BIAS}$ and $Q_{N2BIAS}$ which comprise replicas of gain-enhancement transistors $Q_{P2A}$, $Q_{P2B}$ and $Q_{N2A}$, $Q_{N2B}$, respectively, in amplifier 1300. As illustrated in FIG. 14, the base and collector of each of the gain-enhancement-replica transistors $Q_{P2BIAS}$ and $Q_{N2BIAS}$ are electrically connected such that the transistors $Q_{P2BIAS}$ and $Q_{N2BIAS}$ are diode-connected. The diode-connected transistors $Q_{P2BIAS}$ and $Q_{N2BIAS}$ replicate the voltage drops of the transistors $Q_{P3A}$, $Q_{P3B}$, $Q_{N3A}$, $Q_{N3B}$. In an embodiment, the transistors are bipolar junction transistors comprising a base, a collector and an emitter.

In the embodiment illustrated in FIG. 14, an emitter of the gain-enhancement-replica transistor $Q_{P2BIAS}$ is coupled to the first voltage $V_{DD}$, and the base and collector of the gain-enhancement-replica transistor $Q_{P2BIAS}$ are coupled to an emitter of the input-replica transistor $Q_{N1BIAS}$. An emitter of the input-replica transistor $Q_{N1BIAS}$ is coupled to an inverting input of the operational amplifier $OA_1$ and to a first terminal of the reference current source $I_{01}$. A second terminal of the reference current source $I_{01}$ is coupled to the second voltage GND. A non-inverting input of the operational amplifier $OA_1$ is coupled to a reference voltage $V_{CM}$ and an output of the operational amplifier $OA_1$ is coupled to the base of the input-replica transistor $Q_{N1BIAS}$ and provides the bias voltage $V_{BIASN}$. Via operation of the feedback loops, the voltage biases $V_{BIASP}$ and $V_{BIASN}$ are one transistor base-emitter voltage below and above the reference voltage $V_{CM}$, respectively. In one example, the reference voltage is set to a voltage of $V_{CC}/2$. The voltage biases $V_{BIASP}$ and $V_{BIASN}$ are provided to the bases of transistors $Q_{N1A}$, $Q_{N1B}$, $Q_{P1A}$, $Q_{P1B}$ (FIG. 13) for biasing.

An emitter of the gain-enhancement-replica transistor $Q_{N2BIAS}$ couples to the second voltage GND, and a base and collector of the gain-enhancement-replica transistor $Q_{N2BIAS}$ couples to the collector of the input-replica transistor $Q_{P1BIAS}$. An emitter of the input-replica transistor $Q_{P1BIAS}$ couples to an inverting input of the operational amplifier $OA_2$ and to the first terminal of the reference current source $I_{O2}$. The second terminal of the reference current source $I_{O2}$ couples to the first voltage $V_{DD}$. A non-inverting input of the operational amplifier $OA_2$ couples to the reference voltage $V_{CM}$ and the output of the operational amplifier $OA_2$ couples to the base of the input-replica transistor $Q_{P1BIAS}$ and provides the bias voltage $V_{BIASP}$.

Terminology

The methods, systems, and/or apparatus described above can be implemented into various electronic devices. Examples of the electronic devices can include, but are not limited to, consumer electronic products, parts of the consumer electronic products, electronic test equipment, etc. Examples of parts of consumer electronic products can include amplifiers, rectifiers, programmable filters, attenuators, variable frequency circuits, etc. Examples of the electronic devices can also include memory chips, memory modules, circuits of optical networks or other communication networks, and disk driver circuits. The consumer electronic products can include, but are not limited to, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected," as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

What is claimed is:

1. An apparatus comprising an operational amplifier, the operational amplifier comprising:

an input stage configured to receive a differential input current at an input port and to generate a first voltage signal, the differential current corresponding to a difference between a first input current at a non-inverting input node and a second input current at an inverting input node, the input stage comprising a first input transistor, a second input transistor, a third input transistor, and a fourth input transistor; and a gain-enhancement stage comprising a first gain-enhancement transistor, a second gain-enhancement transistor, a third gain-enhancement transistor, and a fourth gain-enhancement transistor;

the first and third input transistors and the third and fourth gain-enhancement transistors comprising a first semiconductor type, and the second and fourth input transistors and the first and second gain-enhancement comprising a second semiconductor type complementary to the first semiconductor type;

wherein a source or emitter of the first input transistor, a source or emitter of the second input transistor, a gate or base of the second gain-enhancement transistor, and a gate or base of the fourth gain-enhancement transistor are operatively coupled to the non-inverting input node, and wherein a source or emitter of the third input transistor, a source or emitter of the fourth input transistor, a gate or base of the first gain-enhancement transistor, and a gate or base of the third gain-enhancement transistor are operatively coupled to the inverting input node, such that the gates or bases of the gain-enhancement transistors are cross-coupled to the input port to provide a second voltage signal in phase with the first voltage signal.

2. The apparatus of claim 1, wherein a gate or base of the first input transistor and a gate or base of the third input transistor are operatively coupled to a first input stage bias voltage, and wherein a gate or base of the second input transistor and a gate or base of the fourth input transistor are operatively coupled to a second input stage bias voltage.

3. The apparatus of claim 2, further comprising:
a first tail transistor and a second tail transistor;
a common-mode control circuit comprising a first control circuit and a second control circuit wherein the first control circuit is configured to provide a voltage to a gate or base of the first tail transistor and the second control circuit is configured to provide a voltage to a gate or base of the second tail transistor, and wherein through local common-mode negative feedback, the common-mode control circuit is configured to control the first and second tail transistors for biasing DC operating currents of the input stage; and
an output stage configured to provide a differential voltage at an output port, the differential voltage corresponding to a difference between a first output voltage at an inverting output node and a second output voltage at a non-inverting output node, the output stage comprising a first output transistor, a second output transistor, a third output transistor, and a fourth output transistor;
the first and third output transistors comprising the first transistor type, and the second and fourth output transistors comprising the second, complementary transistor type.

4. The apparatus of claim 3, wherein a gate or base of the first output transistor is operatively coupled to a first input of the first control circuit, a drain or collector of the first gain-enhancement transistor, and a drain or collector of the first input transistor, wherein a gate or base of the second output transistor is operatively coupled to a first input of the second control circuit, a drain or collector of the third gain-enhancement transistor, and a drain or collector of the second input transistor, and wherein a drain or collector of the first output transistor and a drain or collector of the second output transistor are operatively coupled to the first output node.

5. The apparatus of claim 4, wherein a gate or base of the third output transistor is operatively coupled to a second input of the first control circuit, a drain or collector of the second gain-enhancement transistor, and a drain or collector of the third input transistor, wherein a gate or base of the fourth output transistor is operatively coupled to a second input of the second control circuit, a drain or collector of the fourth gain-enhancement transistor, and a drain or collector of the fourth input transistor, and wherein a drain or collector of the third output transistor and a drain or collector of the fourth output transistor are operatively coupled to the second output node.

6. The apparatus of claim 5, wherein the first control circuit comprises a first pair of common-mode resistors arranged in series comprising a first end configured to provide the first input, a second end configured to provide the second input, and a common-node configured to provide the output of the first control circuit, and wherein the second control circuit comprises a second pair of common-mode resistors arranged in series comprising a first end configured to provide the first input, a second end configured to provide the second input, and a common-node configured to provide the output of the second control circuit.

7. The apparatus of claim 6, wherein DC drain or collector currents of the first and second output transistors are approximately equal to DC drain or collector currents of the first and second input transistors, and wherein DC drain or collector currents of the third and fourth output transistors are approximately equal to DC drain or collector currents of the third and fourth input transistors.

8. The apparatus of claim 6, wherein the first control circuit further comprises a third common-mode resistor, a first current source, and a second current source, wherein a first node of the first current source is coupled to the gate or base of a first tail transistor and a first end of the third common-mode resistor, wherein a second end of the third common-mode resistor is coupled to the common-node of the first pair of common-mode resistors and a first node of the second current source; and
wherein the second control circuit further comprises a fourth common-mode resistor, a third current source, and a fourth current source, wherein a first node of the third current source is coupled to the gate or base of a second tail transistor and a first end of the fourth common-mode resistor, and wherein a second end of the fourth common-mode resistor is coupled to the common-node of the second pair of common-mode resistors and a first node of the fourth current source; and
wherein currents flowing through the third and the fourth common-mode resistors level-shift voltages at common-mode control circuit inputs to vary drain-source headroom of input stage transistors and gain-enhancement stage transistors.

9. The apparatus of claim 6, wherein the common-mode control circuit further comprises a third control circuit comprising an operational transconductance amplifier and a third pair of common-mode resistors arranged in series comprising a common-node, wherein the third pair of common-mode resistors are operatively coupled to a non-inverting input of the operational transconductance amplifier via the common-node, a first end of the third pair operatively coupled to the inverting output node, and a second end of the third pair operatively coupled to the non-inverting output node;
wherein an inverting input of the operational transconductance amplifier is provided with a common-mode reference voltage, and an output of the operational transconductance amplifier is coupled to the drain or collector of the second tail transistor; and
wherein the operational transconductance amplifier is configured to generate an output DC current that is superimposed on a DC drain or collector current of the second tail transistor and closes a negative feedback loop through the gain-enhancement stage and the output stage.

10. The apparatus of claim 6, wherein the gain-enhancement stage further comprises a first gain-enhancement capacitor, a second gain-enhancement capacitor, and a first pair of gain-enhancement resistors arranged in series comprising a common-node coupled to the common-node of the first common-mode resistor pair, a first end is operatively coupled to the gate or base of the first gain-enhancement transistor, and a second end is operatively coupled to the gate or base of the second gain-enhancement transistor, wherein the gate or base of the first gain-enhancement transistor is AC coupled to the inverting input node through the first gain-enhancement capacitor, and wherein the gate or base of the second gain-enhancement transistor is AC coupled to the non-inverting input node through the second gain-enhancement capacitor.

11. The apparatus of claim 10, wherein the first, second, third and fourth input transistors are biased to reduce transistor threshold voltages, wherein a body diode of the first input transistor and a body diode of the third input transistor are provided with a first forward body bias voltage, and wherein a body diode of the second input transistor and a body diode of the fourth input transistor are provided with a second forward body bias voltage.

12. The apparatus of claim 6, further comprising a bias generator configured to generate the first input bias voltage, the bias generator comprising a first amplifier, a first current source, an input replica transistor, a gain-enhancement replica transistor, and a tail replica transistor;
    wherein an inverting input of the amplifier is coupled to a source or emitter of the input replica transistor, a gate or base of the gain-enhancement replica transistor, and a first node of the current source, wherein a drain or collector of the gain-enhancement replica transistor is coupled to a drain or collector of the input replica transistor and a gate or base of the tail replica transistor, wherein a non-inverting input of the amplifier is coupled to a common-mode reference voltage, and wherein an output of the amplifier provides the first input bias voltage; and
    wherein the input replica transistor is configured to replicate a transistor of the input stage.

13. The apparatus of claim 6, further comprising a bias generator configured to generate the first bias voltage, wherein the bias generator comprises a first amplifier, a first current source, an input replica transistor, and a gain-enhancement replica transistor;
    wherein an inverting input of the amplifier is coupled to a source or emitter of the input replica transistor and a first node of the current source, wherein a drain or collector and gate or base of the gain-enhancement replica transistor are coupled to a drain or collector of the input replica transistor, wherein a non-inverting input of the amplifier is coupled to a common-mode reference voltage, and wherein an output of the amplifier provides the first input bias voltage; and
    wherein a drain or collector circuit of the input replica transistor replicates a drain or collector circuit of the input stage.

14. An apparatus comprising an operational amplifier, the operational amplifier comprising:
    an input stage configured to receive a differential input current signal at a first input node and a second input node, wherein the input stage is configured to be biased by a bias current, wherein transistors of the input stage are configured to operate in a common-gate or common-base configuration;
    a load stage in series with the input stage, wherein the load stage is configured to be biased by the same bias current as the input stage, wherein transistors of the load stage are configured to operate in a common-source or common-emitter configuration, wherein the transistors of the load stage are paired with the transistors of the input stage and are configured to serve as loads for the transistors of the input stage, wherein a pair comprises a first transistor of the input stage having a first semiconductor type and a second transistor of the load stage having a second semiconductor type complementary to the first semiconductor type, wherein a source or emitter of the first transistor is operatively coupled to the first input node, and wherein a gate or base of the second transistor is operatively coupled to the second input node; and
    an output stage configured to generate an output signal, the output stage comprising a plurality of transistors including a third transistor, wherein the third transistor is configured to operate in a common-source or common-emitter configuration, wherein the third transistor is of the first semiconductor type, wherein a gate or base of the third transistor is operatively coupled to the source or emitter of the first transistor and to a drain or collector of the second transistor, and wherein a drain or collector of the third transistor is configured to drive a portion of the output signal.

15. The apparatus of claim 14, wherein the output signal comprises a differential output signal, the apparatus further comprising:
    a first tail transistor configured to source current to the load stage;
    a second tail transistor configured to sink current from the load stage; and
    a common-mode control circuit configured to bias the first tail transistor and the second tail transistor for control of a common-mode voltage of the output signal to control a common-mode voltage of the differential output signal.

16. The apparatus of claim 1 wherein the source or emitter of the first input transistor comprises the source of the first input transistor, the source or emitter of the second input transistor comprises the source of the second input transistor, the source or emitter of the third input transistor comprises the source of the third input transistor, and the source or emitter of the fourth input transistor comprises the source of the fourth input transistor, and wherein the gate or base of the first gain-enhancement transistor comprises the gate of the first gain-enhancement transistor, the gate or base of the second gain-enhancement transistor comprises the gate of the second gain-enhancement transistor, the gate or base of the third gain-enhancement transistor comprises the gate of the third gain-enhancement transistor, and the gate or base of the fourth gain-enhancement transistor comprises the gate of the fourth gain-enhancement transistor.

17. The apparatus of claim 1 wherein the source or emitter of the first input transistor comprises the emitter of the first input transistor, the source or emitter of the second input transistor comprises the emitter of the second input transistor, the source or emitter of the third input transistor comprises the emitter of the third input transistor, and the source or emitter of the fourth input transistor comprises the emitter of the fourth input transistor, and wherein the gate or base of the first gain-enhancement transistor comprises the base of the first gain-enhancement transistor, the gate or base of the second gain-enhancement transistor comprises the base of the second gain-enhancement transistor, the gate or base of the third gain-enhancement transistor comprises the base of the third gain-enhancement transistor, and the gate or base of the fourth gain-enhancement transistor comprises the base of the fourth gain-enhancement transistor.

18. The apparatus of claim 14 wherein the transistors of the input stage are configured to operate in a common-gate configuration and the transistors of the load stage are configured to operate in a common-source configuration, and wherein the source or emitter of the first transistor comprises the source of the first transistor and the gate or base of the second transistor comprises the gate of the second transistor.

19. The apparatus of claim 14 wherein the transistors of the input stage are configured to operate in a common-base configuration and the transistors of the load stage are configured to operate in a common-emitter configuration, and wherein the source or emitter of the first transistor comprises the emitter of the first transistor and the gate or base of the second transistor comprises the base of the second transistor.

* * * * *